US011217769B2

(12) United States Patent
Kishimoto et al.

(10) Patent No.: US 11,217,769 B2
(45) Date of Patent: Jan. 4, 2022

(54) ORGANIC LIGHT EMITTING DISPLAY DEVICE

(71) Applicant: Samsung Display Co., Ltd., Yongin-si (KR)

(72) Inventors: Hirotsugu Kishimoto, Hwaseong-si (KR); Jung-Su Kim, Asan-si (KR); Eun-Jae Na, Suwon-si (KR); Dong-Myung Shin, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 189 days.

(21) Appl. No.: 15/465,520

(22) Filed: Mar. 21, 2017

(65) Prior Publication Data

US 2018/0047938 A1 Feb. 15, 2018

(30) Foreign Application Priority Data

Aug. 12, 2016 (KR) .................. 10-2016-0103290

(51) Int. Cl.
*H01L 51/52* (2006.01)
*H01L 27/32* (2006.01)
*H01L 51/00* (2006.01)

(52) U.S. Cl.
CPC ........ *H01L 51/5253* (2013.01); *H01L 27/323* (2013.01); *H01L 27/3244* (2013.01);
(Continued)

(58) Field of Classification Search
CPC ............. H01L 51/5253; H01L 51/0097; H01L 2251/5338; H01L 51/5246; H01L 23/60; H01L 27/323; H01L 27/3272
See application file for complete search history.

(56) References Cited

U.S. PATENT DOCUMENTS

2014/0002385 A1* 1/2014 Ka .................. G06F 1/1601
345/173
2014/0252342 A1 9/2014 Ramadas et al.
(Continued)

FOREIGN PATENT DOCUMENTS

KR 10-2007-0105030 10/2007
KR 10-2008-0027565 3/2008
(Continued)

OTHER PUBLICATIONS

The Extended European Search Report dated Dec. 18, 2017, in European Patent Application No. 17186035.6.

*Primary Examiner* — Tuan A Hoang
(74) *Attorney, Agent, or Firm* — H.C. Park & Associates, PLC

(57) ABSTRACT

An organic light emitting display device includes a flexible display panel having a display region where a plurality of pixels are disposed and a pad region where pad electrodes that are electrically connected to an external device are disposed, the pad region being located at a side of the display region, the display panel being configurable to have a curved shape where a flexible portion of the display region is bent, an upper structure in the display region of the display panel, and a lower protection film on a lower surface of the display panel, and including an adhesive layer and a protection layer. The adhesive layer is in direct contact with the lower surface of the display panel, and includes an antistatic material. The protection layer is disposed under the adhesive layer.

26 Claims, 21 Drawing Sheets

(52) U.S. Cl.
CPC ...... *H01L 27/3276* (2013.01); *H01L 51/0097* (2013.01); *H01L 51/5293* (2013.01); *H01L 2251/5338* (2013.01); *Y02E 10/549* (2013.01)

(56) References Cited

U.S. PATENT DOCUMENTS

| | | |
|---|---|---|
| 2015/0028293 A1 | 1/2015 | Jung |
| 2015/0102296 A1* | 4/2015 | Kim .................. H01L 27/32 257/40 |
| 2016/0181346 A1* | 6/2016 | Kwon ................ H01L 27/124 257/40 |
| 2017/0198170 A1* | 7/2017 | Clapper .................... C09J 5/00 |
| 2018/0004023 A1* | 1/2018 | Ide .......................... G02F 1/136 |

FOREIGN PATENT DOCUMENTS

| | | |
|---|---|---|
| KR | 10-2009-0101761 | 9/2009 |
| KR | 10-2012-0071962 | 7/2012 |
| WO | 2013062486 | 5/2013 |
| WO | 2016/111895 | 7/2016 |

\* cited by examiner

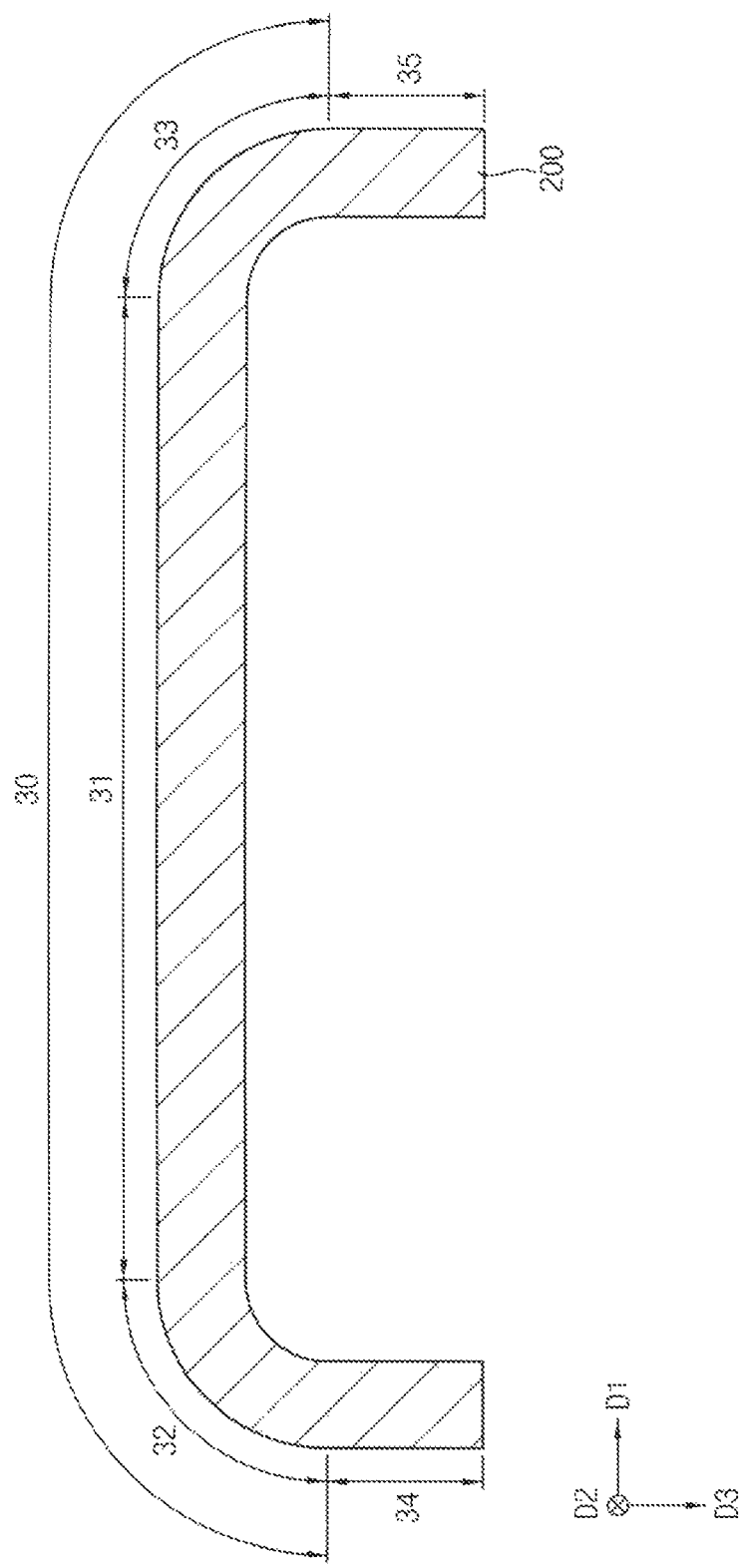

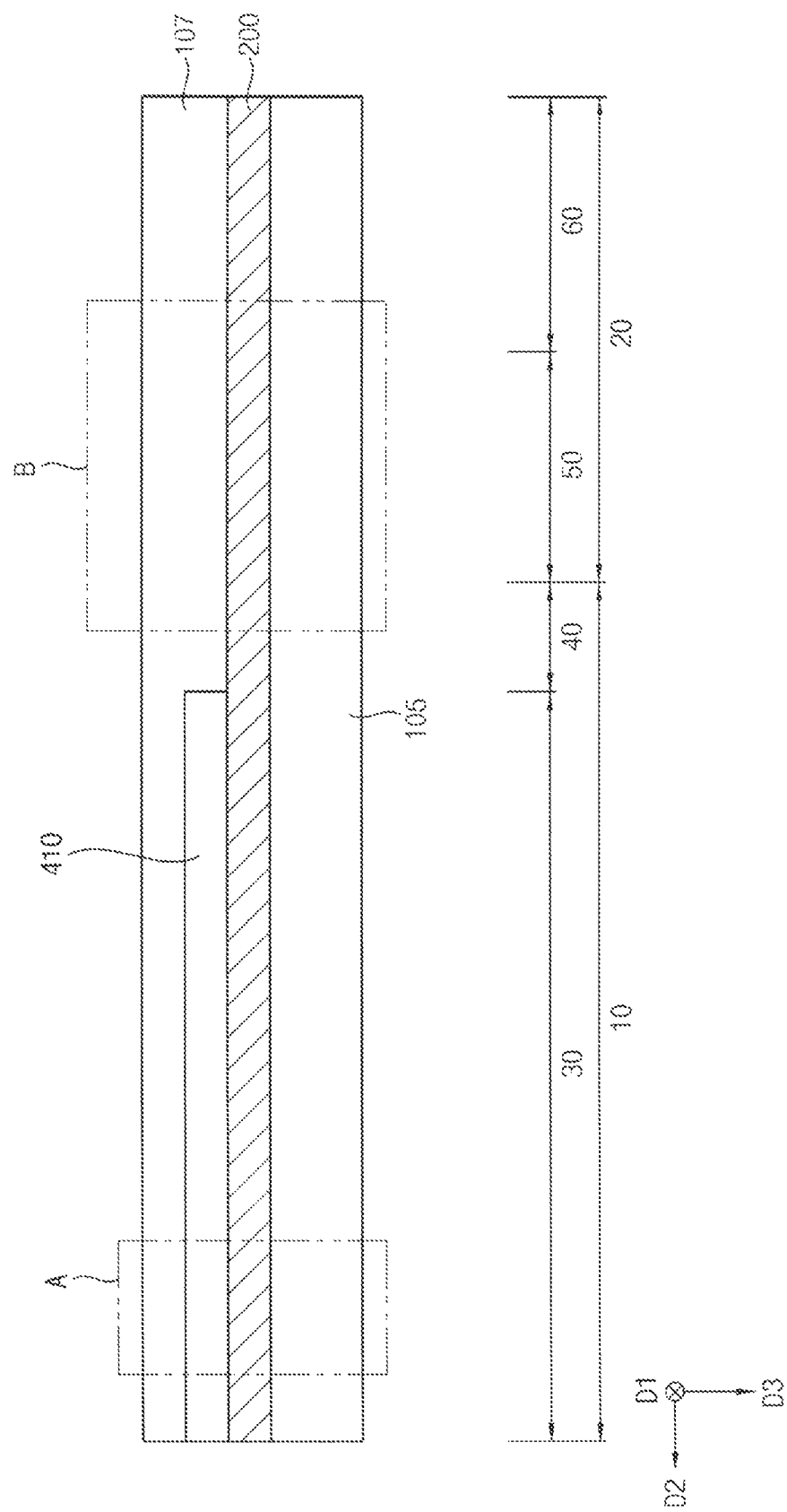

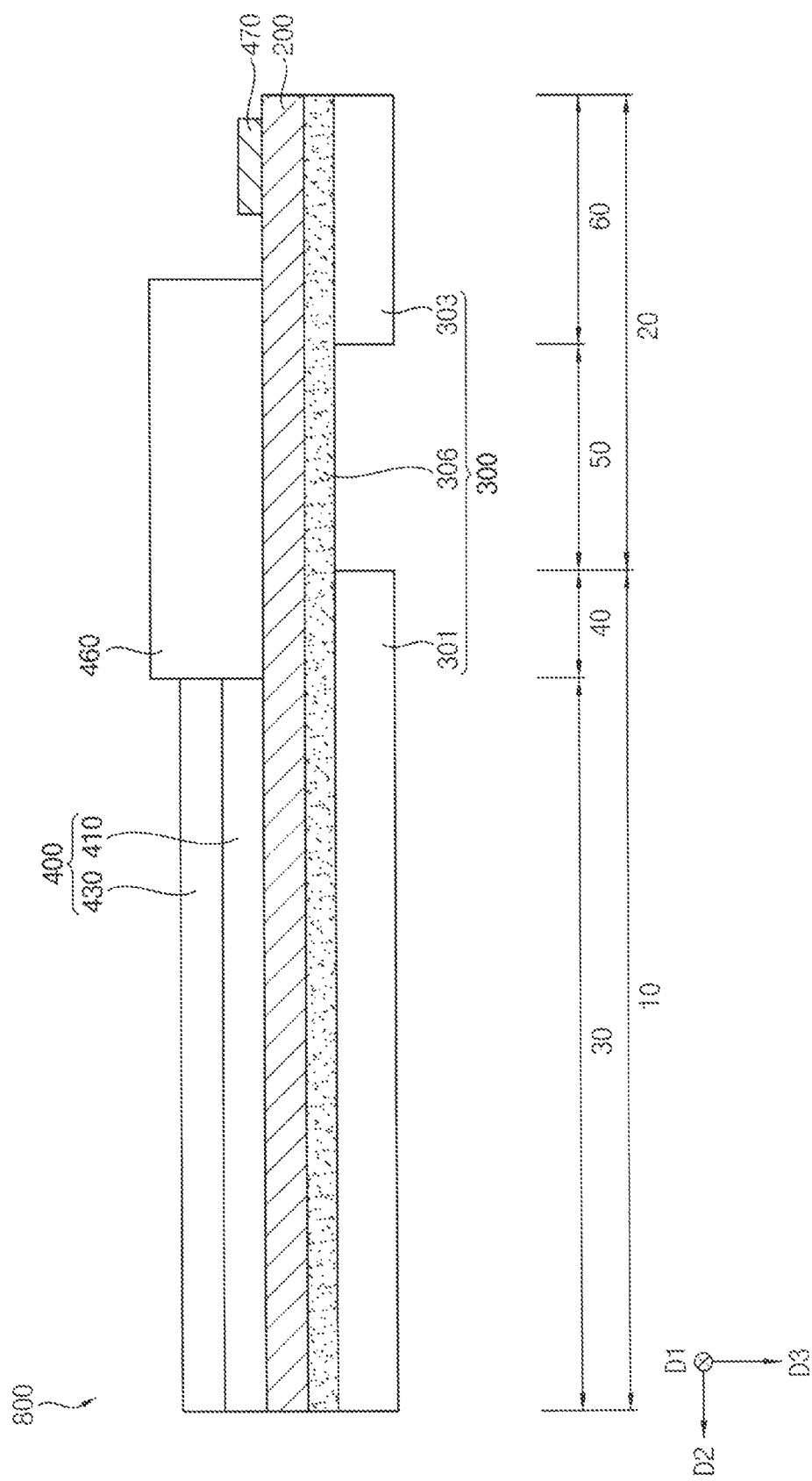

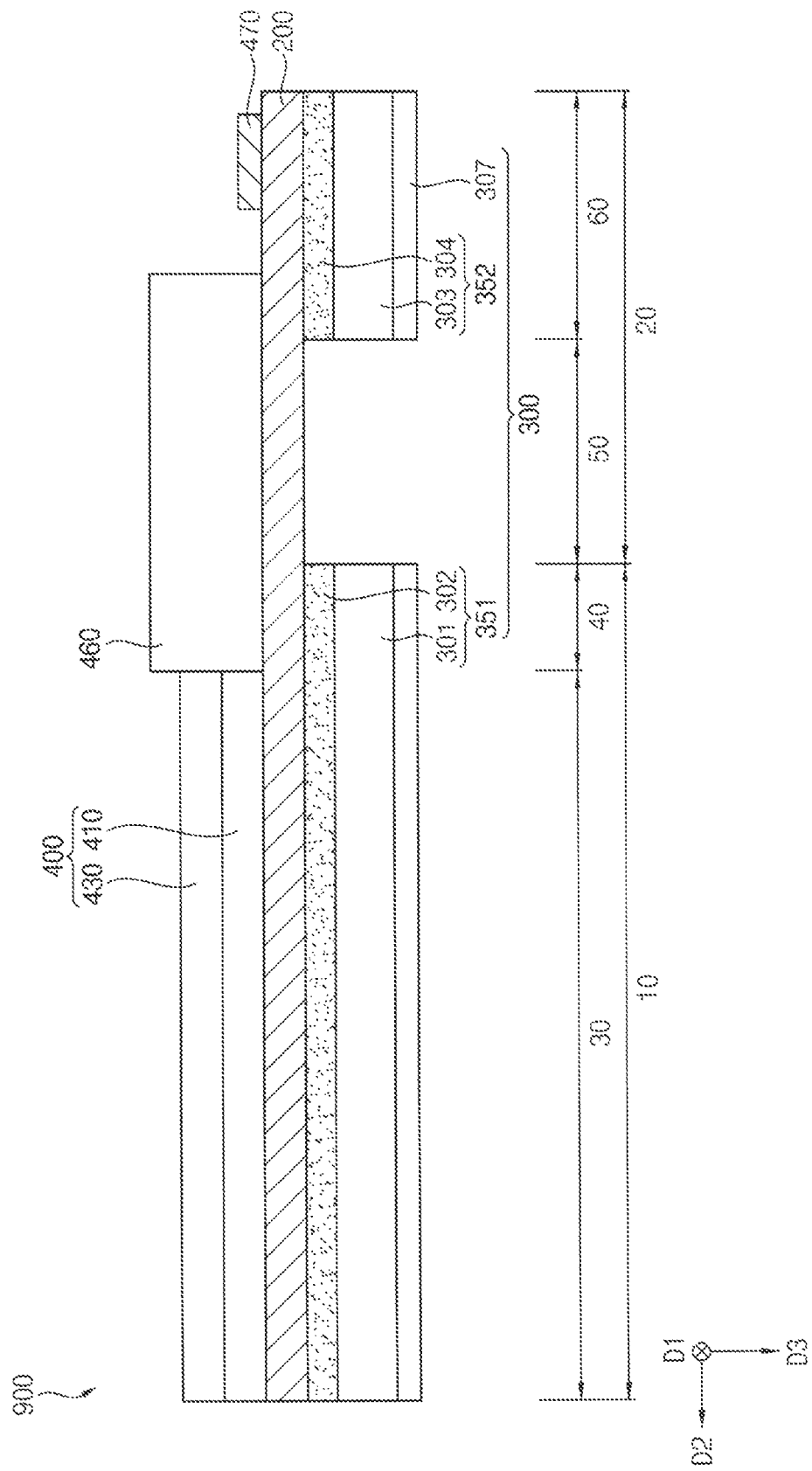

ORGANIC LIGHT EMITTING DISPLAY DEVICE

CROSS-REFERENCE TO RELATED APPLICATION

This application claims priority from and the benefit of Korean Patent Application No. 10-2016-0103290, filed on Aug. 12, 2016, which is hereby incorporated by reference for all purposes as if fully set forth herein.

BACKGROUND

Field

The invention relates generally to organic light emitting display devices, and, more particularly, to organic light emitting display devices that are flexible and resistant to damage or defects due to static electricity.

Discussion of the Background

Flat panel display (FPD) devices are widely used as a display device of an electronic device because the FPD device is lightweight and thin compared to a cathode-ray tube (CRT) display device. Typical examples of the FPD devices are a liquid crystal display (LCD) device and an organic light emitting display (OLED) device.

Recently, a flexible OLED device has been developed that is capable of bending or folding a portion of a display device by including lower and upper substrates which have flexible materials. For example, the lower substrate included in the display panel may be formed of a flexible substrate, and the upper substrate included in the display panel may have a thin film encapsulation structure. In addition, the flexible display device may further include an upper structure that is located on an upper surface of the display panel and a lower protection film that is located on a lower surface of the display panel. Here, the lower protection film may include an adhesive layer and a protection film that protects the adhesive layer.

The above information disclosed in this Background section is only for enhancement of understanding of the background of the inventive concepts, and, therefore, it may contain information that does not form the prior art that is already known in this country to a person of ordinary skill in the art.

SUMMARY

Applicants have discovered that when the lower protection film of a flexible OLED adheres to the lower surface of the display panel, it may adhere after the protection film has become detached from the adhesive layer. In this case, static electricity may be generated as the protective film is detached from the adhesive layer, and the flexible display device may be damaged by the static electricity. Additionally, the presence of non-uniform static electric may cause a displayed image to be non-uniform.

One or more exemplary embodiments of the invention provide an organic light emitting display device having an adhesive layer that includes an antistatic material having a surface resistance that enables static electric charges to achieve a uniform distribution in the adhesive layer and/or migrate to a grounded process device. Accordingly, the performance of the device may be improved by reducing or eliminating some or all of the problems caused by static electricity. Further, a weight ratio the antistatic material with respect to the total weight of the adhesive layer may be in a range that enables some or all of problems caused by the static electricity to be overcome without adding much weight to the device.

Additional aspects or benefits will be set forth in the detailed description which follows, and, in part, will be apparent from the disclosure, or may be learned by practice of the inventive concepts.

According to a one aspect of the invention, an organic light emitting display (OLED) device includes a flexible display panel, an upper structure, and a lower protection film. The display panel has a display region where a plurality of pixels are disposed and a pad region where pad electrodes that are electrically connected to an external device are disposed. The pad region is located at a side of the display region. The display panel is configurable to have a curved shape where a flexible portion of the display region is bent. The upper structure is disposed in the display region of the display panel. The lower protection film is disposed on a lower surface of the display panel, and includes an adhesive layer and a protection layer. The adhesive layer is in direct contact with the lower surface of the display panel, and includes an antistatic material. The protection layer is disposed under the adhesive layer.

In example embodiments, the display region may have a first width extending in a first direction, and the pad region may have a second width extending in the first direction when viewed in a plan view of the OLED device. The second width may be less than the first width.

In example embodiments, the display region may include a first sub-display region having opposed lateral portions, second and third sub-display regions, a fourth sub-display region, and a fifth sub-display region. The first sub-display region may be located in a center of the display region. The second sub-display region may be located at one of the opposed lateral portions of the first sub-display region and the third sub-display region may be located at the other opposed lateral portion. The second and third sub-display regions may be configured to have a shape that is bent on an axis with respect to a second direction. The second direction may be perpendicular to the first direction. The fourth sub-display region may be located adjacent to the second sub-display region, and may extend in a third direction that is orthogonal to both the first direction and the second direction. The fifth sub-display region may be located adjacent to the third sub-display region, and may extend in the third direction.

In example embodiments, the second and fourth sub-display regions and the third and fifth sub-display regions may be symmetrical to each other with respect to the first sub-display region.

In example embodiments, the display region may include a light emitting region configured to emit light and a peripheral region surrounding the light emitting region. The first sub-display region, the second sub-display region, and the third sub-display region may be located in the light emitting region, and the fourth sub-display region and the fifth sub-display region may be located in the peripheral region.

In example embodiments, the lower protection film may be disposed on a portion of the lower surface of the display panel that is located in the first, second, third, fourth, and fifth sub-display regions or on substantially the entire lower surface of the display panel that is located in the first, second, third, fourth, and fifth sub-display regions.

In example embodiments, a neutral plane of the lower protection film, the display panel, and the upper structure in the second and third sub-display regions are located within the display panel.

In example embodiments, a thickness of the adhesive layer of the lower protection film may be in a range between about 11 and about 15 micrometers, and a thickness of the protection layer of the lower protection film may be in a range between about 74 and about 76 micrometers.

In example embodiments, a plurality of wirings may be disposed in the peripheral region, and the plurality of wirings may electrically connect the pad electrodes and the pixels.

In example embodiments, the pad region may include a bending region located in a first portion of the pad region that is adjacent to the display region and a pad electrode region where the pad electrodes are disposed in a second portion of the pad region.

In example embodiments, the OLED device may further include a bending protection layer and connection electrodes. The bending protection layer may be disposed in a portion of the display region, the bending region, and a portion of the pad electrode region. The connection electrodes may be disposed between the bending protection layer and the display panel, and may electrically connect the pixels and the pad electrodes.

In example embodiments, the lower protection film may expose a portion of the lower surface of the display panel that is located in the bending region.

In example embodiments, the lower protection film may include a first lower protection film pattern and a second lower protection film pattern. The first lower protection film pattern may be disposed in the display region. The second lower protection film pattern may be disposed in the pad electrode region of the pad region such that the portion of the lower surface of the display panel that is located in the bending region is exposed.

In example embodiments, the first lower protection film pattern and the second lower protection film pattern may be spaced apart from each other.

In example embodiments, the bending region may be bent on an axis with respect to the first direction, and the second lower protection film pattern may be disposed on a lower surface of the first lower protection film pattern.

In example embodiments, a bending radius of the bending region may be less than a bending radius of a portion of the display region where the display region is bent.

In example embodiments, the lower protection film may define a groove in the bending region.

In example embodiments, the adhesive layer included in the lower protection film may be entirely disposed on the lower surface of the display panel. The protection layer included in the lower protection film may include a first protection layer and a second protection layer. The first protection layer may be disposed in the display region. The second protection layer may be disposed in the pad region. The first protection layer and the second protection layer may define an opening exposing a lower surface of the adhesive layer located in the bending region. The first protection layer and the second protection layer may be spaced apart from each other on the lower surface of the adhesive layer.

In example embodiments, each of the pixels included in the display panel may include a substrate on the lower protection film, a semiconductor element on the substrate, a lower electrode on the semiconductor element, a light emitting layer on the lower electrode, an upper electrode on the light emitting layer, and a thin film encapsulation structure on the upper electrode.

In example embodiments, the semiconductor element may include an active layer, a gate insulation layer, a gate electrode, an insulating interlayer, and source and drain electrodes. The active layer may be disposed on the substrate. The gate insulation layer may be disposed on the active layer. The gate electrode may be disposed on the gate insulation layer. The insulating interlayer may be disposed on the gate electrode, and the gate insulation layer and the insulating layer may define an opening that exposes an upper surface of the substrate that is located in the bending region. The source and drain electrodes may be disposed on the insulating interlayer.

In example embodiments, the upper structure may include a touch screen electrode layer and a polarizing layer on the thin film encapsulation structure.

In example embodiments, the polarizing layer may be disposed on the touch screen electrode layer.

In example embodiments, the touch screen electrode layer may be disposed on the polarizing layer.

In example embodiments, the lower protection film may further include an antistatic layer under the protection layer.

In example embodiments, a thickness of the protection layer may be greater than a thickness of the adhesive layer, and the thickness of the adhesive layer may be greater than a thickness of the antistatic layer.

In example embodiments, a surface resistance of an upper surface of the lower protection film that is in direct contact with the display panel may be less than about $1 \times 10^{11}$ ohm/sq.

In example embodiments, a weight ratio the antistatic material based on a total weight of the adhesive layer may be in a range between about 1 wt % and about 3 wt %.

In example embodiments, the protection layer may further include a light blocking material.

In example embodiments, the light blocking material may include at least one material selected from the group consisting of carbon black, titanium nitride oxide, titanium black, phenylene black, aniline black, cyanine black, and nigrosine acid black.

According to another aspect of the invention, an OLED device includes a display panel, an upper structure, and a lower protection film. The display panel has a display region where a plurality of pixels are disposed and a pad region where pad electrodes that are electrically connected to an external device are disposed. The pad region is located at a first side of the display region. The display panel is configurable to have a curved shape where a flexible portion of the display region is bent. The upper structure is disposed in the display region of the display panel. The lower protection film is disposed on a lower surface of the display panel, and includes an adhesive layer and a protection layer. The adhesive layer is in direct contact with the lower surface of the display panel, and includes an antistatic material. The protection layer is disposed under the adhesive layer. The pad region includes a bending region located in a first portion of the pad region that is adjacent to the display region and a pad electrode region where the pad electrodes are disposed in a second portion of the pad region. The lower protection film includes a first lower protection film pattern and a second lower protection film pattern. The first lower protection film pattern is disposed in the display region. The second lower protection film pattern is disposed in the pad electrode region of the pad region such that the portion of the lower surface of the display panel that is located in the bending region is exposed. The antistatic material is included in the first lower protection film pattern, and the second lower protection film pattern does not include the antistatic material.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 2B is a cross sectional view illustrating part of the structure of the display panel of FIG. 2A;

FIGS. 5A, 5B, 5C, 6, 7, and 8 are cross-sectional views illustrating various stages of an exemplary method of manufacturing an OLED device according to the principles of the invention;

FIG. 11 is a cross-sectional view of a fourth embodiment of an OLED device constructed according to the principles of the invention; and FIG. 12 is a cross-sectional view of a fifth embodiment of an OLED device constructed according to the principles of the invention.

DETAILED DESCRIPTION OF THE ILLUSTRATED EMBODIMENTS

Figure 1A:
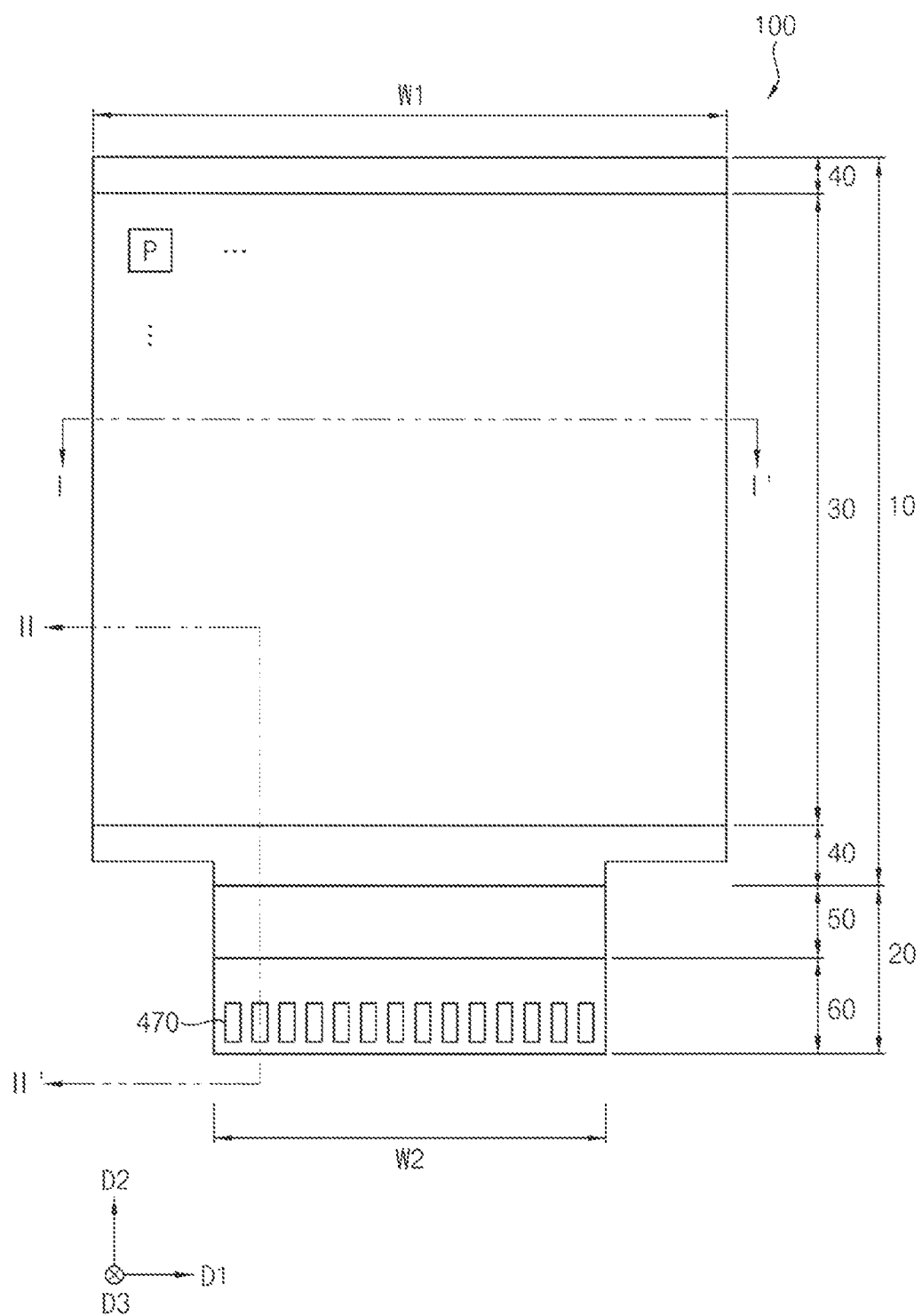
FIG. 1A is a plan view of a first embodiment of an organic light emitting display (OLED) device constructed according to the principles of the invention in which the OLED has a flat shape before any bending of the display region.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, embodiments constructed according to the principles of the invention will be explained in detail with reference to the accompanying drawings.

Figure 1B:
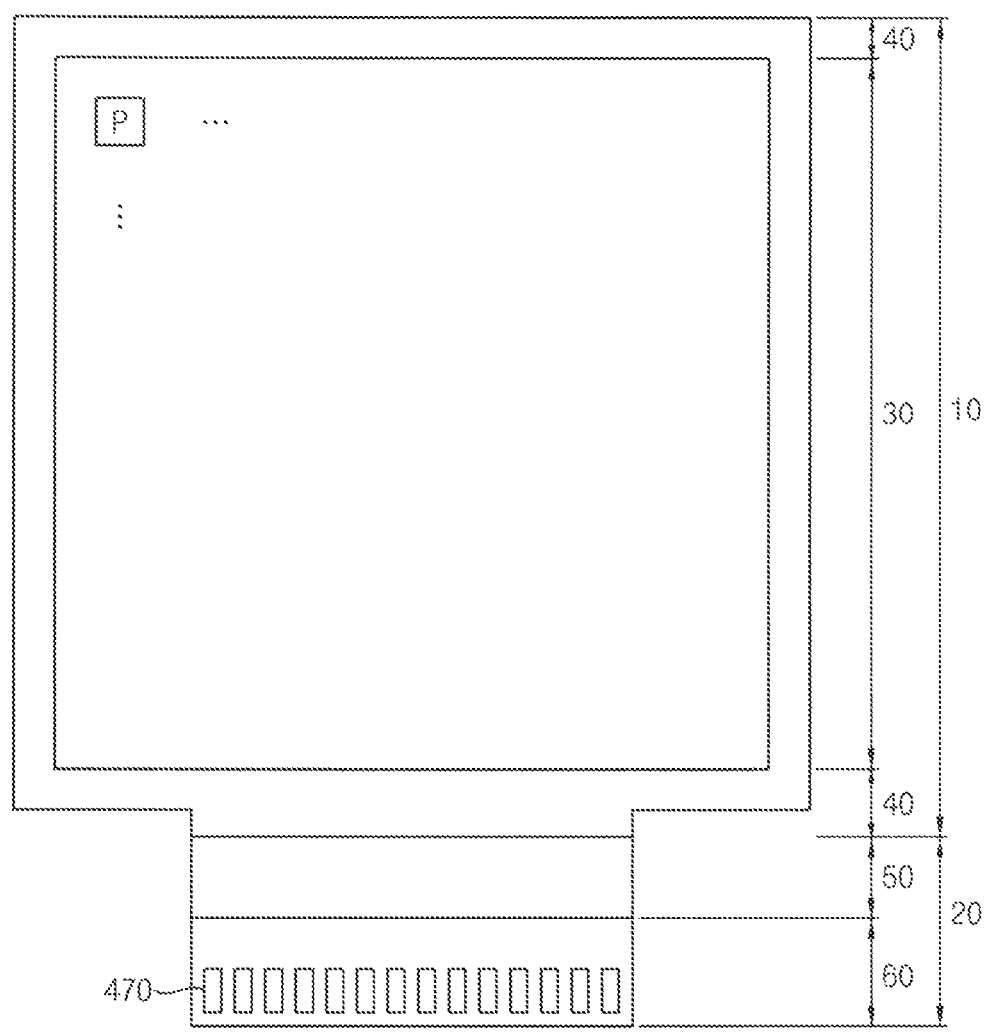
FIG. 1B is a plan view of a peripheral region included in the OLED device of FIG. 1A illustrating the OLED after a portion of the display region has been bent.
Figure 1C:
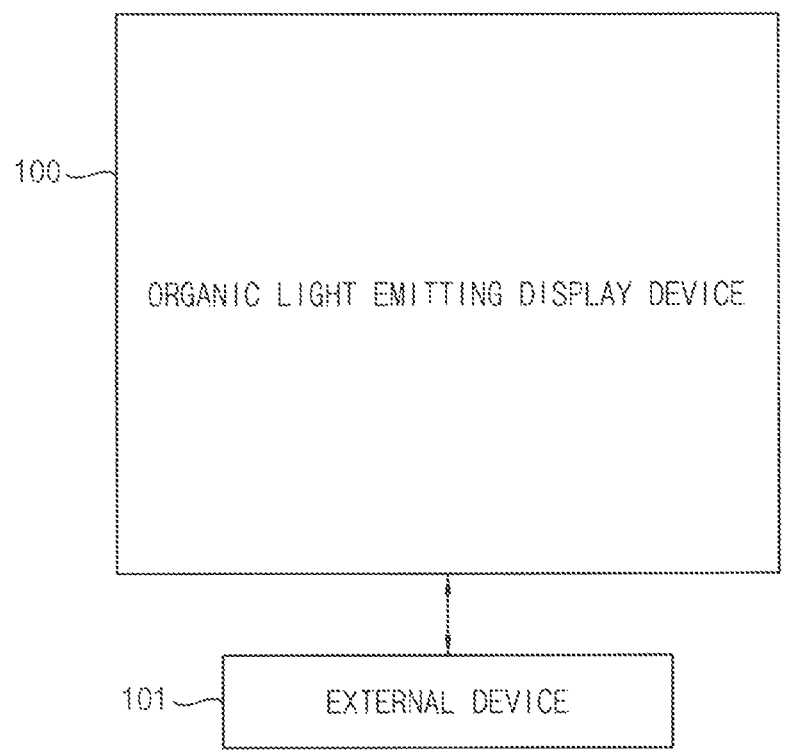
FIG. 1C is a block diagram of an external device electrically connected to the OLED device of FIG. 1A.

Referring to FIGS. 1A, 1B, and 1C, an OLED device 100 may include a display panel, an upper structure, a lower protection film, etc., as will be described in greater detail below.

The display panel may have a display region 10 and a pad region 20. A plurality of pixels P may be disposed in the display region 10, and the pad region 20 may be located in a first side of the display region 10. A width of the pad region 20 may be less than a width of the display region 10, and pad electrodes 470 that are electrically connected to an external device 101 may be disposed in the pad region 20. The display region 10 may have a first width W1 extending in a first direction D1 that is parallel to an upper surface of the OLED device 100 when viewed in a plan view of the OLED device 100. In addition, the pad region 20 may have a second width W2 extending in the first direction D1 when viewed in a plan view of the OLED device 100, and the second width W2 may be less than the first width W1.

The display region 10 may include a light emitting region 30 where a light is emitted and a peripheral region 40 that surrounds the light emitting region 30. The pixels P emitting a light may be disposed in the light emitting region 30, and a plurality of wirings may be disposed in the peripheral region 40. The wirings may be electrically connected to the pad electrodes 470 and the pixels P. For example, the wirings may include data signal wirings, scan signal wirings, light emission signal wirings, power supply voltage wirings, and so on. In addition, a scan driver, a data driver, and other components may be disposed in the peripheral region 40.

The width of the peripheral region 40 surrounding the light emitting region 30 of FIG. 1B may be the same on each side of the light emitting region 30; or, the width of the peripheral region 40 may be different on different sides of the light emitting region. For example, the peripheral region 40 may include a first region extending in the first direction D1 and a second region extending in a second direction D2 that is perpendicular to the first direction D1. In other words, the first region of the peripheral region 40 may be located adjacent to the top of the display panel 200 and a bending region 50, and the second region of the peripheral region 40 may be located in both lateral portions of the display panel 200. Here, a width extending in the first direction D1 of the second region may be relatively less than a width extending in the second direction D2 of the first region.

The pad region 20 may include a bending region 50 located in a portion of the pad region 20 that is adjacent to the display region 10 and a pad electrode region 60 located in a remaining portion of the pad region 20. For example, the bending region 50 may be interposed between the display region 10 and the pad electrode region 60, and the pad electrodes 470 may be disposed in the pad electrode region 60. As the bending region 50 is bent, the pad electrode region 60 may be located on a lower surface of the OLED device 100. As described in further detail below, the OLED device 100 may further include a bending protection layer and connection electrodes. The bending protection layer may be disposed in a portion of the display region 10, the bending region 50, and a portion of the pad electrode region 60 on the display panel as will be described in greater detail below. The connection electrodes may be disposed between the bending protection layer and the display panel, and may be electrically connected to the wirings and the pad electrodes 470. As illustrated in FIG. 1C, the pixels P disposed in the light emitting region 30 and an external device 101 that is electrically connected to the pad electrodes 470 may be electrically connected through the connection electrodes disposed in the bending region 50 and the wirings disposed in the peripheral region 40. For example, the external device 101 and the OLED device 100 may be electrically connected through a flexible printed circuit board (FPCB). The external device 101 may provide a data signal, a scan signal, a light emission signal, a power supply voltage, and so on, to the OLED device 100. In addition, a driving integrated circuit may be mounted (e.g., installed) in the FPCB. In some example embodiments, the driving integrated circuit may be mounted in the display panel 200 that is located adjacent to the pad electrodes 470.

The upper structure may be disposed in the display region 10 on the display panel. As will be described in greater detail below, the upper structure may include a touch screen electrode layer, a polarizing layer, and so on. In example embodiments, the touch screen electrode layer may be disposed on the display panel, and the polarizing layer may be disposed on the touch screen electrode layer.

As described below, the lower protection film may be disposed on a lower surface of the display panel, and may include an adhesive layer and a protection layer. The adhesive layer may be in direct contact with a lower surface of the display panel, and may include an antistatic material. In addition, the protection layer may be disposed under the adhesive layer.

Because the OLED device 100 includes an adhesive layer having antistatic material, the OLED device 100 may protect the display panel from a static electricity.

Figure 2A:
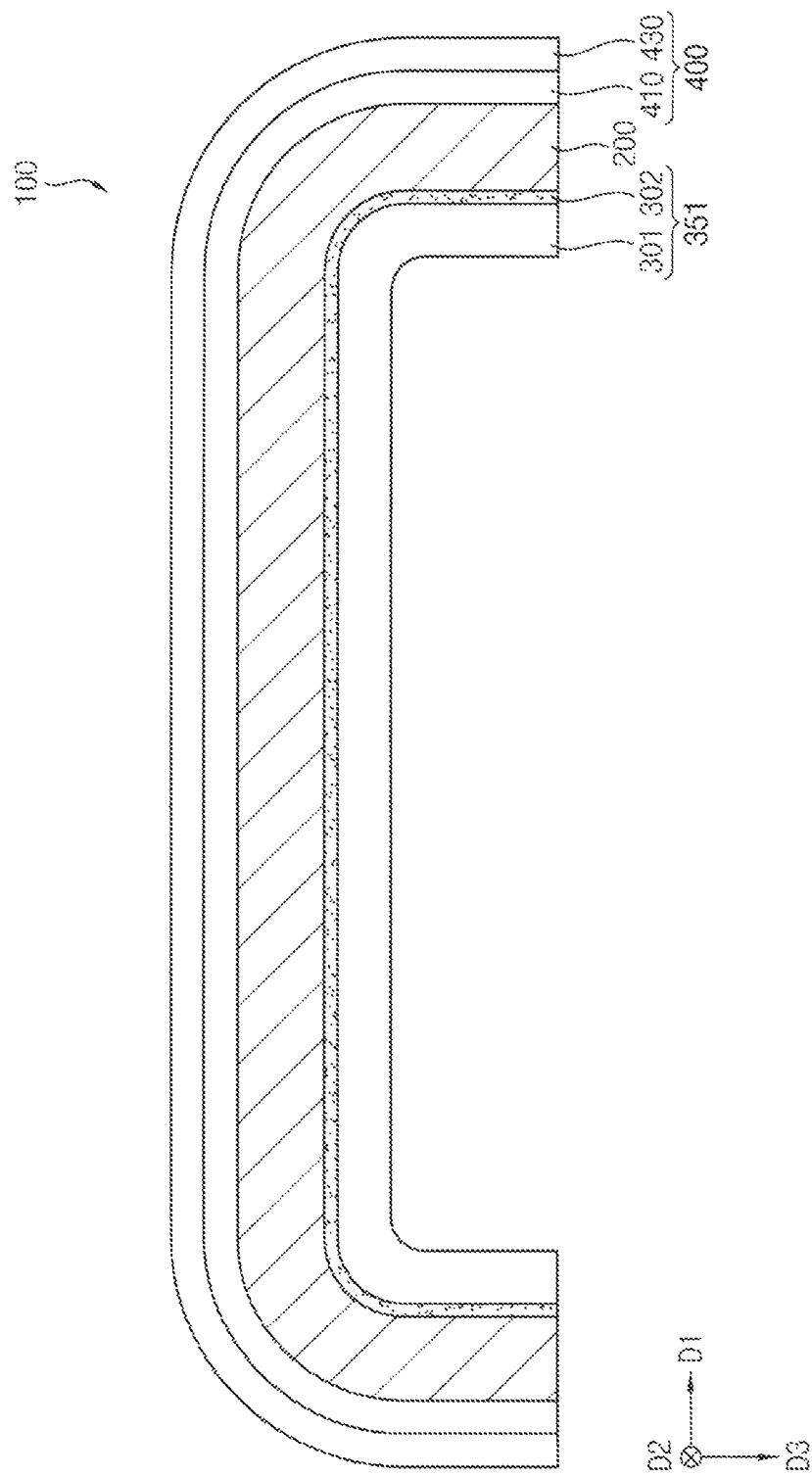
FIG. 2A is a cross-sectional view taken along a line I-I' of FIG. 1A.

Referring to FIGS. 1A, 2A, and 2B, an upper structure 400 may be disposed in a display region 10 on a display panel 200 included in an OLED device 100, and a first lower protection film pattern 351 included in a lower protection film may be disposed on a lower surface of the display panel 200. The upper structure 400 may include a touch screen electrode layer 410 and a polarizing layer 430. In addition, the first lower protection film pattern 351 may include a first protection layer 301 and a first adhesive layer 302. The touch screen electrode layer 410 may be disposed on the display panel 200, and the polarizing layer 430 may be disposed on the touch screen electrode layer 410. In addition, the first adhesive layer 302 may be disposed on a lower surface of the display panel 200, and the first protection layer 301 may be disposed under the first adhesive layer 302.

As illustrated in FIG. 2B, the display panel 200 may have the display region 10, and the display region 10 may include a light emitting region 30 and a peripheral region 40. The display region 10 may include a first sub-display region 31, a second sub-display region 32, a third sub-display region 33, a fourth sub-display region 34, and a fifth sub-display region 35. For example, the first sub-display region 31, the second sub-display region 32, and the third sub-display region 33 may be included in the light emitting region 30, and the fourth sub-display region 34 and the fifth sub-display region 35 may be included in the peripheral region 40. The first sub-display region 31 may be located in the center of the display region 10, and the second sub-display region 32 and the third sub-display region 33 may be located in lateral portions of the first sub-display region 31. Each of the second sub-display region 32 and the third sub-display region 33 may have a shape that is bent on an axis with respect to a second direction D2 which may be perpendicular to a first direction D1. The fourth sub-display region 34 may be located adjacent to the second sub-display region 32, and may extend in a third direction D3 that may be vertical to the first and second directions D1 and D2. The fifth sub-display region 35 may be located adjacent to the third sub-display region 33, and may extend in the third direction D3. In example embodiments, the second and fourth sub-display regions 32 and 34 and the third and fifth sub-display regions 33 and 35 may be symmetrical to each other with respect to the first sub-display region 31. The first lower protection film pattern 351 may be partially or entirely disposed on a lower surface of the display panel 200 that may be located in the first, second, third, fourth, and fifth sub-display regions 31, 32, 33, 34, and 35.

Figure 2C:
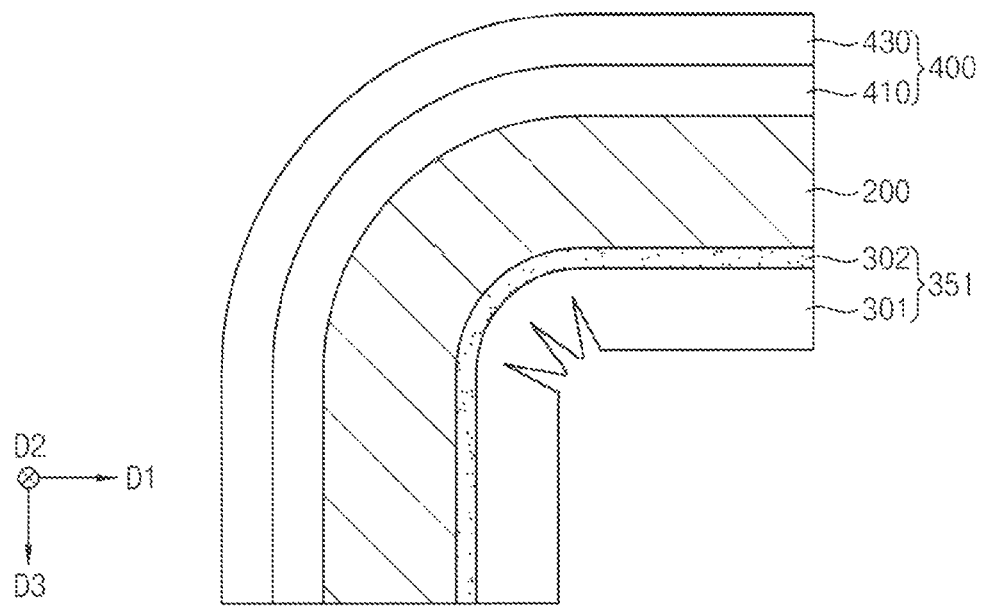
FIG. 2C is a cross sectional view illustrating a first example of a bent portion of the display panel of FIG. 2A.
Figure 2D:
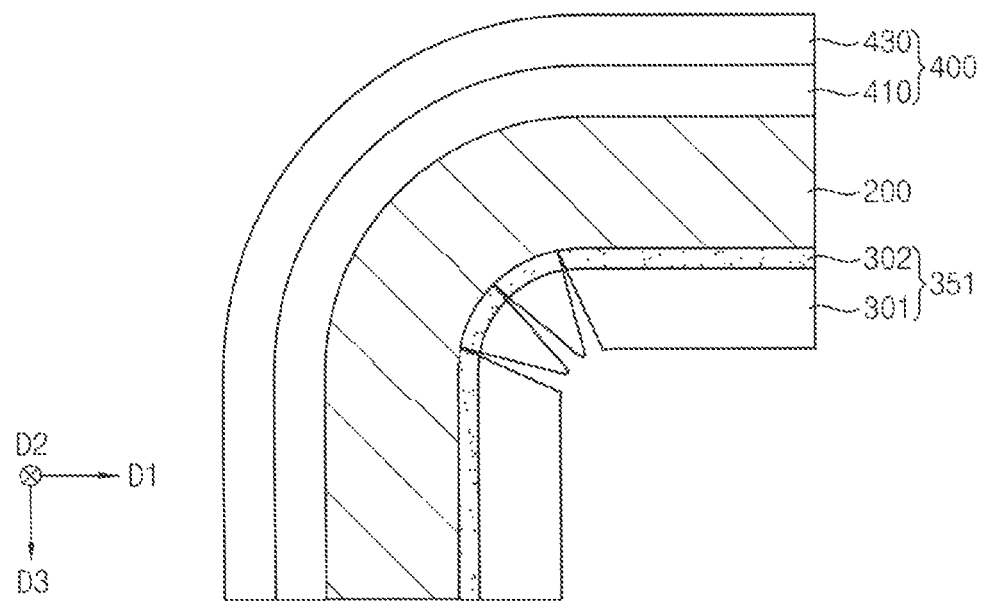
FIG. 2D is a cross sectional view illustrating a second example of a bent portion of the display panel of FIG. 2A.
Figure 2E:
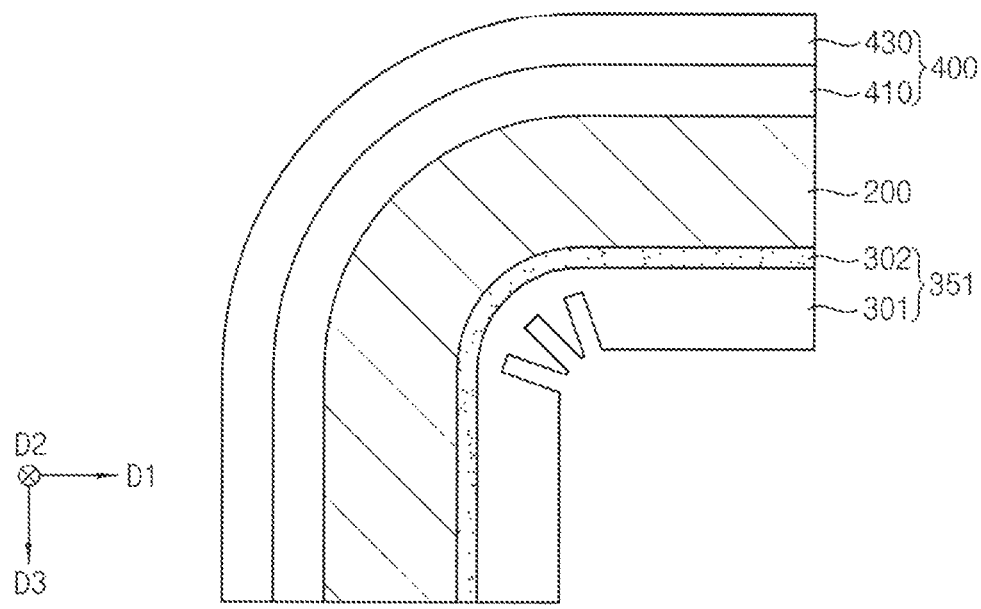
FIG. 2E is a cross sectional view illustrating a third example of a bent portion of the display panel of FIG. 2A.
Figure 2F:
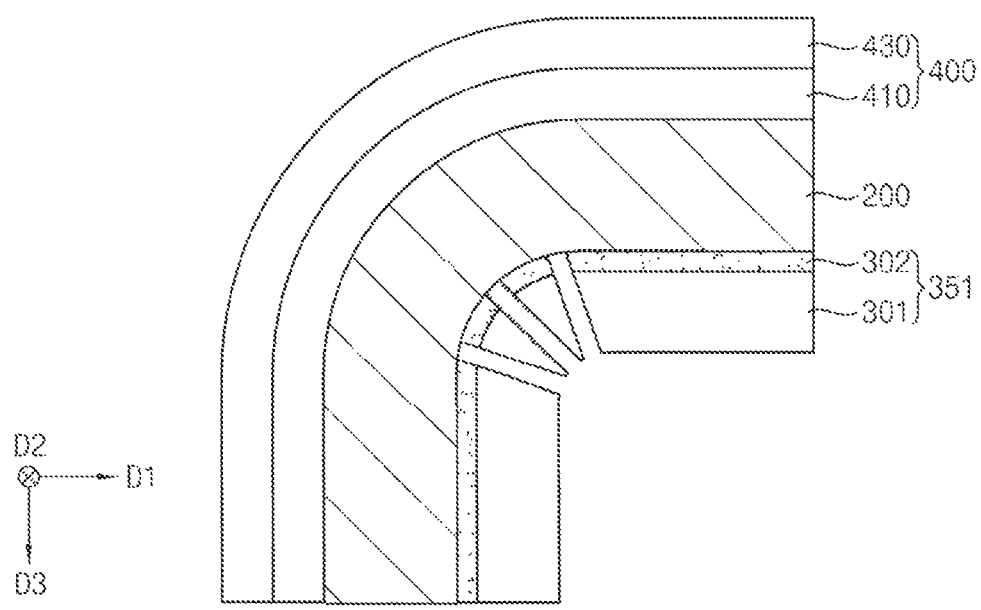
FIG. 2F is a cross sectional view illustrating a fourth example of a bent portion of the display panel of FIG. 2A.

Referring to FIGS. 2C, 2D, 2E and 2F, variously shaped patterns may be formed by removing at least a portion of a lower protection film 300 in a portion where the display region 10 is bent. These patterns may be formed by alternating convex projections separated by concave spaces between the convex projections, but other shape projections may also be employed. In other words, the lower protection film 300 may have the variously shaped patterns defined therein. For example, as illustrated in FIGS. 2C and 2E, the patterns may be formed by removing a portion of the first protection layer 301. Alternatively, as illustrated in FIGS. 2D and 2F, the patterns may be formed by partially or completely removing the first protection layer 301 and the first adhesive layer 302 such that the display panel 200 is exposed in a particular location where the display region 10 is bent. Examples of the shape of the patterns as depicted in FIGS. 2C, 2D, and 2E include a trapezoidal shape and a tetragonal shape. It should be apparent that the shapes formed by the removal of the portion of the lower protection film 300 may be different in other embodiments. Thus, in other embodiments, the shape of the patterns may vary from the shapes depicted in FIGS. 2C, 2D, 2E and 2F.

Figure 3A:
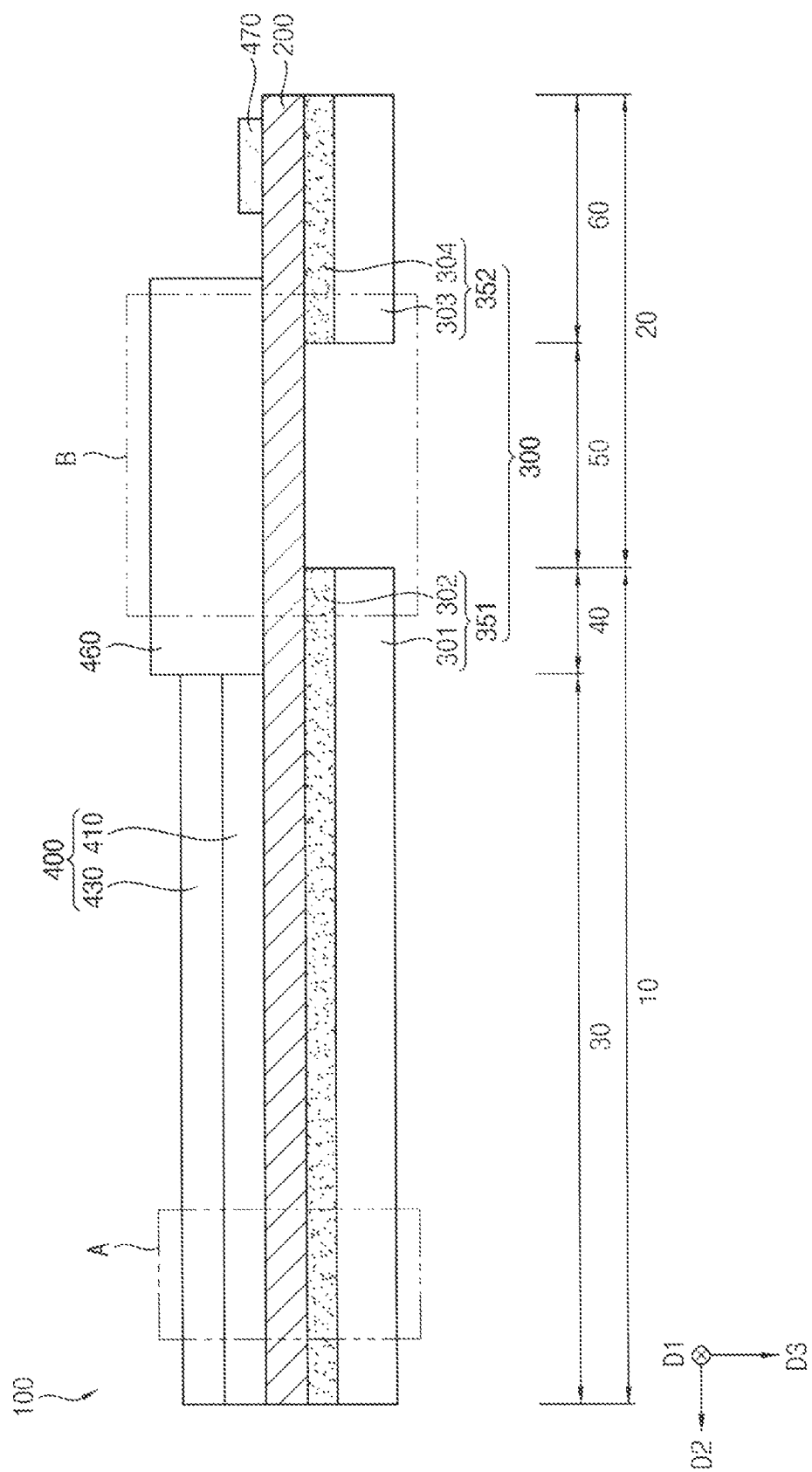
FIG. 3A is a cross-sectional view taken along a line II-II' of FIG. 1A.
Figure 3B:
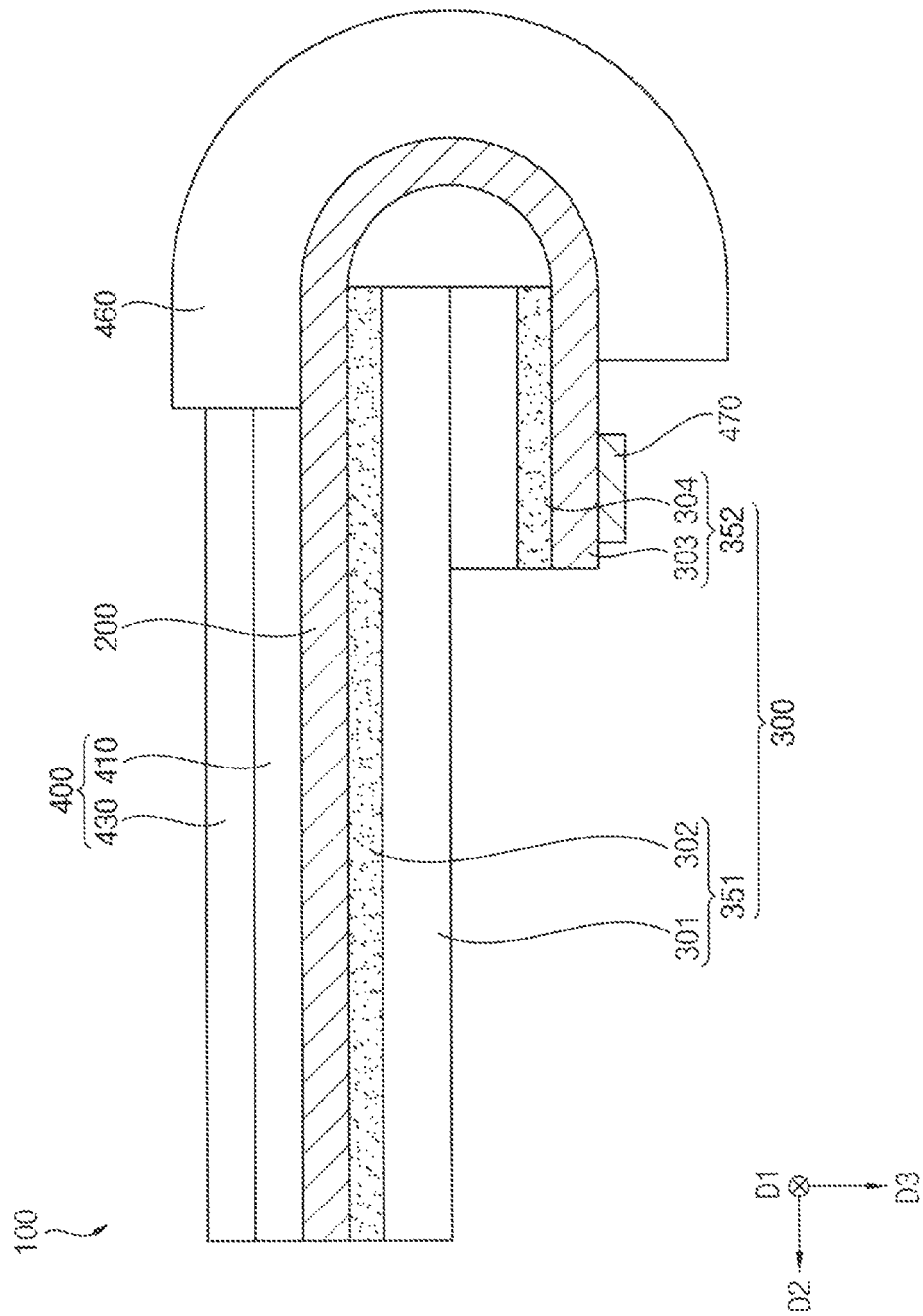
FIG. 3B is a cross-sectional view illustrating a bent shape of the OLED device of FIG. 3A.

Referring to FIGS. 1A, 3A, and 3B, the OLED device 100 may include a display panel 200, a lower protection film 300, an upper structure 400, a bending protection layer 460, a pad electrode 470, and so on. Here, the lower protection film 300 may include a first lower protection film pattern 351 and a second lower protection film pattern 352. In addition, the first lower protection film pattern 351 may include a first protection layer 301 and a first adhesive layer 302; and, the second lower protection film pattern 352 may include a second protection layer 303 and a second adhesive layer 304. Further, the upper structure 400 may include a polarizing layer 430 and a touch screen electrode layer 410.

As described above, the display panel 200 may have a display region 10 and a pad region 20. The display region 10 may include a light emitting region 30 and a peripheral region 40; and, the pad region 20 may include a bending region 50 and a pad electrode region 60.

Pixels P where a light is emitted may be disposed in the light emitting region 30; and, a plurality of wirings may be disposed in the peripheral region 40. The wirings may be electrically connected to the pad electrode 470 and the pixels P.

The bending region 50 of the pad region 20 may be interposed between the pad electrode region 60 and the peripheral region 40 of the display region 10, and the pad electrode 470 may be disposed in the pad electrode region 60.

Referring to FIG. 3B, as the bending region 50 is bent, the pad electrode region 60 may be located on a lower portion of the OLED device 100. For example, the bending region 50 may be bent on an axis with respect to a first direction D1; and, the second lower protection film pattern 352 may be disposed on a lower surface of the first lower protection film pattern 351. In addition, a bending radius of the bending region 50 may be less than a bending radius of a portion having a shape where the display region 10 is bent. That is, the portion where the display region 10 is bent has a gradual slope whereas the bending region 50 may have a relatively steep slope. Alternatively, after the bending region 50 is bent, an adhesive tape may be interposed between the second lower protection film pattern 352 and the first lower protection film pattern 351. In this case, the second lower protection film pattern 352 and the first lower protection film pattern 351 may be fixed by the adhesive tape. A thickness of the adhesive tape may be identical to or greater than a thickness of the lower protection film 300. In addition, the adhesive tape may absorb shock. For example, the adhesive tape may include urethane, rubber, and/or the like.

Referring again to FIGS. 1A and 3A, the upper structure 400 may be disposed in the display region 10 on the display panel 200. The touch screen electrode layer 410 may be disposed on the display panel 200; and, the polarizing layer 430 may be disposed on the touch screen electrode layer 410.

The lower protection film 300 may be disposed on a lower surface of the display panel 200. In example embodiments, the lower protection film 300 may include the first lower protection film pattern 351 that is disposed in the display region 10 and the second lower protection film pattern 352 that is disposed in the pad electrode region 60 such that a lower surface of the display panel 200 located in the bending region 50 is exposed. In other words, the lower protection film 300 may have an opening exposing a lower surface of the display panel 200 in the bending region 50. In addition, the first adhesive layer 302 and the second adhesive layer 304 may be in direct contact with a lower surface of the display panel 200, and may include antistatic materials. Further, each of the first protection layer 301 and the second protection layer 303 may be disposed under the first adhesive layer 302 and the second adhesive layer 304, respectively.

The bending protection layer 460 may be disposed in a portion of the display region 10, the bending region 50, and a portion of the pad electrode region 60 on the display panel 200. Connection electrodes may be disposed between the bending protection layer 460 and the display panel 200. The connection electrodes may be electrically connected to the wirings disposed in the peripheral region 40 and the pad electrode 470. Pixels P disposed in the light emitting region 30 and an external device 101 that is electrically connected to the pad electrode 470 may be electrically connected through the connection electrodes disposed in the bending region 50 and through the wirings disposed in the peripheral region 40. A thickness of the bending protection layer 460 may be determined such that a neutral plane in the bending region 50 is located within a portion where the connection electrodes are disposed. For example, when the bending region 50 is bent, the connection electrodes might not be broken (or, cut) because the neutral plane of the bending region 50 may be located within the portion where the connection electrodes are disposed.

The pad electrode 470 may be disposed in the pad electrode region 60 on the display panel 200. The pad electrode 470 may be electrically connected to the external device 101, and may provide a data signal, a scan signal, a light emission signal, a power supply voltage, and so on, which may be applied from the external device 101, to the pixels P.

The upper structure 400 may include the touch screen electrode layer 410 and the polarizing layer 430; and, in some embodiments, the upper structure 400 may further include a plurality of layers.

Figure 4A:
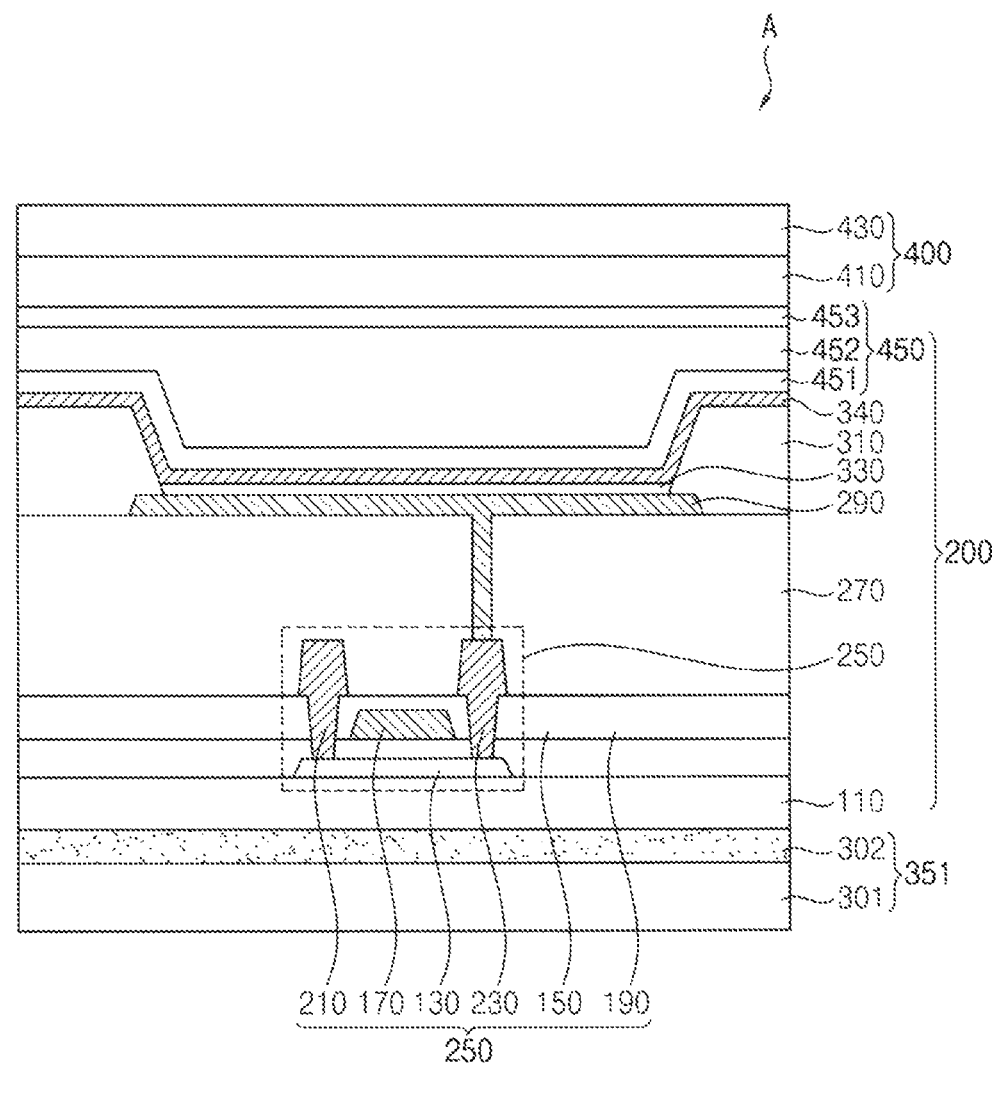
FIG. 4A is an enlarged cross-sectional view of region 'A' of FIG. 3A.
Figure 4B:
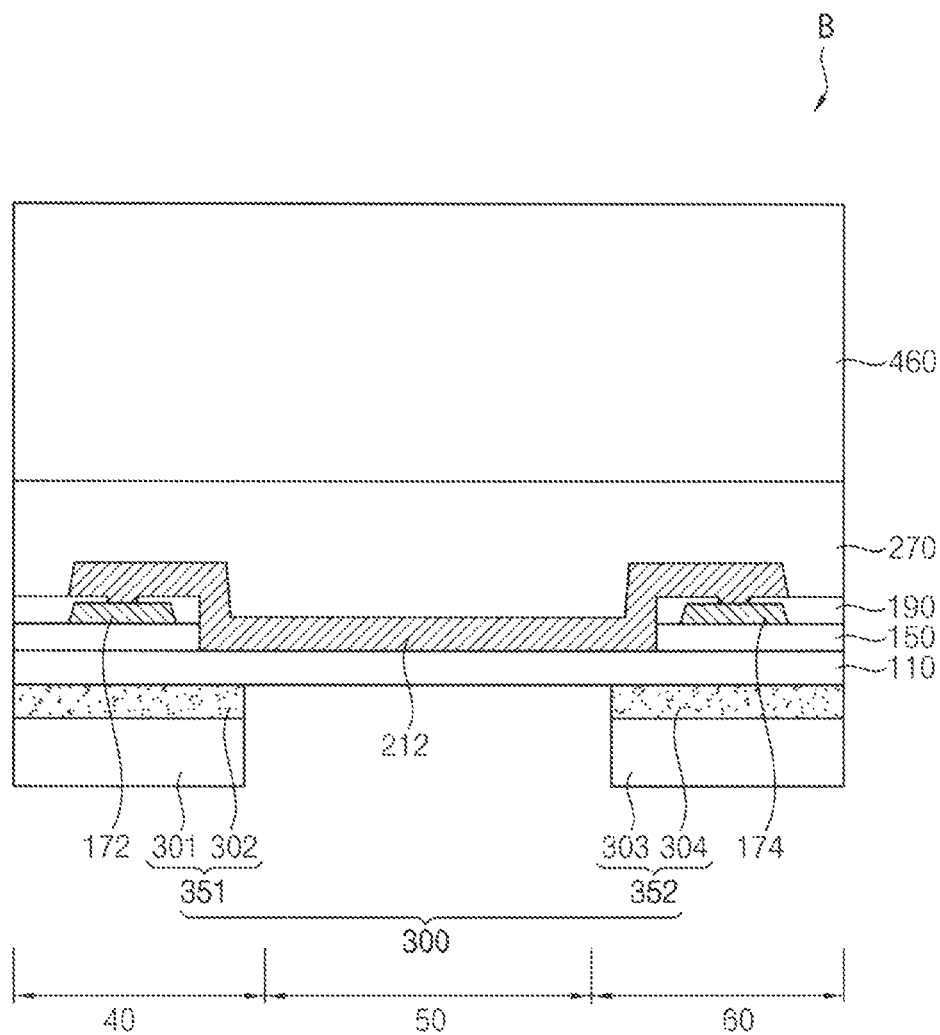
FIG. 4B is an enlarged cross-sectional view of region 'B' of FIG. 3A.

Referring to FIGS. 4A and 4B, an OLED device 100 may include a display panel 200, a lower protection film 300, an upper structure 400, a bending protection layer 460, and so on. The display panel 200 may include a substrate 110, a semiconductor element 250, a planarization layer 270, a pixel defining layer 310, a lower electrode 290, a light emitting layer 330, an upper electrode 340, and a thin film encapsulation (TFE) structure 450. In addition, the upper structure 400 may include a touch screen electrode layer 410 and a polarizing layer 430. Further, the semiconductor element 250 may include an active layer 130, a gate insulation layer 150, a gate electrode 170, an insulating interlayer 190, a source electrode 210, and a drain electrode 230; and, the TFE structure 450 may include first TFE layer 451, a second TFE layer 452, and a third TFE layer 453.

When the OLED device 100 includes the flexible substrate 110 and the TFE structure 450, the OLED device 100 may serve as a flexible display device.

The substrate 110 may be provided. The substrate 110 may include transparent materials or opaque materials. The substrate 110 may be formed of a flexible transparent material such as a flexible transparent resin substrate (e.g., a polyimide substrate). For example, the polyimide substrate may include a first polyimide layer, a first barrier film layer, a second polyimide layer, a second barrier film layer, and so on. Because the polyimide substrate is relatively thin and flexible, the polyimide substrate may be disposed on a rigid glass substrate to help support the formation of the semiconductor element 250 and the light emitting structure (e.g., the lower electrode 290, the light emitting layer 330, the upper electrode 340, and so on). That is, the substrate 110 may have a structure in which the first polyimide layer, the first barrier film layer, the second polyimide layer, and the second barrier film layer are stacked on the rigid glass substrate. In manufacturing the OLED device 100, after an insulating layer (e.g., a buffer layer) is provided on the second barrier layer of the polyimide substrate, the semiconductor element 250 and the light emitting structure may be disposed on the insulating layer. After the semiconductor element 250 and the light emitting structure are formed on the insulating layer, the rigid glass substrate on which the polyimide substrate is disposed may be removed. It may be difficult to directly form the semiconductor element 250 and the light emitting structure on the polyimide substrate when the polyimide substrate is relatively thin and flexible. Accordingly, the semiconductor element 250 and the light emitting structure may be formed on the polyimide substrate and the rigid glass substrate, and then the polyimide substrate may serve as the substrate 110 of the OLED device 100 after the removal of the rigid glass substrate. Alternatively, the substrate 110 may include a quartz substrate, a synthetic quartz substrate, a calcium fluoride substrate, a fluoride-doped quartz substrate, a sodalime glass substrate, a non-alkali glass substrate and so on.

A buffer layer may be disposed on the substrate 110. The buffer layer may be disposed on a part of or the entire substrate 110. The buffer layer may prevent the diffusion of metal atoms and/or impurities from the substrate 110 into the semiconductor element 250. Additionally, the buffer layer may control a rate of heat transfer in a crystallization process for forming the active layer 130, thereby obtaining a substantially uniform active layer 130. Furthermore, the buffer layer may improve a surface flatness of the substrate 110 when a surface of the substrate 110 is relatively irregular. Depending on the form of the substrate 110, at least two buffer layers may be provided on the substrate 110, or, alternatively, the buffer layer might be omitted. The buffer layer may include silicon compound, metal oxide, and so on.

The semiconductor element 250 may be disposed on the substrate 110. The active layer 130 may be disposed on the substrate 110. The active layer 130 may include an oxide semiconductor, an inorganic semiconductor (e.g., amorphous silicon, polysilicon, and/or the like), an organic semiconductor, and so on.

The gate insulation layer 150 may be disposed on the active layer 130. The gate insulation layer 150 may cover the active layer 130, and may be disposed on the substrate 110. For example, the gate insulation layer 150 may sufficiently cover the active layer 130 on the substrate 110, and may have a substantially level surface without a step around the active layer 130. Alternatively, the gate insulation layer 150 may cover the active layer 130, and may be disposed as a substantially uniform thickness along a profile of the active layer 130. The gate insulation layer 150 may include an opening that exposes an upper surface of the substrate 110. The upper surface of the substrate 110 may be located in a portion of the peripheral region 40, the bending region 50, and a portion of pad electrode region 60. The gate insulation layer 150 may include silicon compound, metal oxide, and so on. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), and/or the like.

The gate electrode 170 may be disposed on a portion of the gate insulation layer 150 under which the active layer 130 may be located. The gate electrode 170 may include a metal, a metal alloy, metal nitride, conductive metal oxide, transparent conductive materials, and so on. For example, the gate electrode 170 may include gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), and/or the like. These may be used alone or in a suitable combination thereof. The gate electrode 170 may have a multi-layered or single layered structure.

The insulating interlayer 190 may be disposed on the gate electrode 170. The insulating interlayer 190 may cover the gate electrode 170, and may be disposed on the gate insulation layer 150. For example, the insulating interlayer 190 may sufficiently cover the gate electrode 170 on the gate insulation layer 150, and may have a substantially level surface without a step around the gate electrode 170. Alternatively, the insulating interlayer 190 may cover the gate electrode 170 on the gate insulation layer 150, and may be disposed as a substantially uniform thickness along a profile of the gate electrode 170. The insulating interlayer 190 may expose an upper surface of the substrate 110; and, the upper surface of the substrate 110 may be located in a portion of the peripheral region 40, the bending region 50, and a portion of pad electrode region 60. In addition, a width, extending in the second direction D2, of an opening defined by the gate insulation layer 150 and the insulating interlayer 190 that expose an upper surface of the display panel 200 may be greater than a with extending the second direction D2 of an opening defined by the lower protection film 300 that exposes a lower surface of the display panel 200. The insulating interlayer 190 may include a silicon compound, a metal oxide, and so on.

The source electrode 210 and the drain electrode 230 may be disposed on the insulating interlayer 190. The source electrode 210 may be in direct contact with a first side of the active layer 130 via a contact hole formed by removing a portion of the gate insulation layer 150 and the insulating interlayer 190. The drain electrode 230 may be in direct contact with a second side of the active layer 130 via a contact hole formed by removing another portion of the gate insulation layer 150 and the insulating interlayer 190. The source electrode 210 and the drain electrode 230 may include a metal, an alloy, metal nitride, conductive metal oxide, transparent conductive materials, and/or the like. These may be used alone or in a suitable combination thereof. Each of the source and drain electrodes 210 and 230 may have a multi-layered structure. Accordingly, the semiconductor element 250 including the active layer 130, the gate insulation layer 150, the gate electrode 170, the insulating interlayer 190, the source electrode 210, and the drain electrode 230 may be disposed.

The semiconductor element 250 may or might not have a top gate structure. Likewise, the semiconductor element 250 may or might not have a bottom gate structure.

As illustrated in FIG. 4B, a first conductive pattern 172 may be disposed in the peripheral region 40 on the gate insulation layer 150. As described above, the first conductive pattern 172 may be one among a plurality of the wirings. For example, the first conductive pattern 172 may include a data signal wiring, a scan signal wiring, a light emission signal wiring, a power supply wiring, and so on.

A second conductive pattern 174 may be disposed in the pad electrode region 60 on the gate insulation layer 150. The second conductive pattern 174 may be electrically connected to the pad electrode 470.

A connection electrode 212 may be disposed in a portion of the peripheral region 40, the bending region 50, and the a portion of the pad electrode region 60 on the insulating interlayer 190 to overlap the first conductive pattern 172 and the second conductive pattern 174. The connection electrode 212 may be in contact with the first conductive pattern 172 via a contact hole formed by removing a portion of the insulating interlayer 190 located in the peripheral region 40, and may be in contact with the second conductive pattern 174 via a contact hole formed by removing a portion of the insulating interlayer 190 located in the pad electrode region 60. The first conductive pattern 172, the second conductive pattern 174, and the gate electrode 170 may be simultaneously (i.e., concurrently) formed using the same material. In addition, the connection electrode 212, the source electrode 210, and the drain electrode 230 may be simultaneously formed using the same material.

Accordingly, an external device 101 and the OLED device 100 may be electrically connected through the pad electrode 470 and a FPCB, and the external device 101 may provide a data signal, a scan signal, a light emission signal, a power supply voltage, and so on, to the pixels through the second conductive pattern 174, the connection electrode 212, and the first conductive pattern 172.

Referring again to FIGS, 4A and 4B, the planarization layer 270 may be disposed on the connection electrode 212, the source electrode 210, and the drain electrode 230. The planarization layer 270 may cover the connection electrode 212, the source electrode 210, and the drain electrode 230, and may be disposed on a part of or the entire insulating interlayer 190. The planarization layer 270 may be formed with a thickness sufficient to cover at least a portion of the connection electrode 212 and the source and drain electrodes 210 and 230. The planarization layer 270 may have a substantially flat upper surface; and, a planarization process may be further performed on the planarization layer 270 to obtain the flat upper surface of the planarization layer 270. Alternatively, the planarization layer 270 may cover the connection electrode 212 and the source and drain electrodes 210 and 230, and may be disposed as a substantially uniform thickness along a profile of the connection electrode 212 and the source and drain electrodes 210 and 230. The planarization layer 270 may include organic materials and/or inorganic materials. Thus, in some embodiments the planarization layer 270 may include only organic materials.

The lower electrode 290 may be disposed on the planarization layer 270. The lower electrode 290 may be in contact with the drain electrode 230 via a contact hole formed by removing a portion of the planarization layer 270. In addition, the lower electrode 290 may be electrically connected to the semiconductor element 250. The lower electrode 290 may include a metal, a metal alloy, metal nitride, conductive metal oxide, transparent conductive materials, and so on. These may be used alone or in a suitable combination thereof. The lower electrode 290 may or might not have a multi-layered structure.

The pixel defining layer 310 may be disposed on the planarization layer 270 and may expose a portion of the lower electrode 290. The light emitting layer 330 may be disposed on the portion of the lower electrode 290 exposed by the pixel defining layer 310. The pixel defining layer 310 may expose the bending region 50 and the pad electrode region 60. The pixel defining layer 310 may include organic materials and/or inorganic materials. Thus, in some embodiments, the pixel defining layer 310 may include only organic materials.

The light emitting layer 330 may be disposed in a portion where the portion of the lower electrode 290 is exposed. The light emitting layer 330 may be formed using at least one of certain light emitting materials capable of generating different colors of light (e.g., a red color of light, a blue color of light, a green color of light, and so on) according to sub-pixels. Alternatively, the light emitting layer 330 may generate a generally white color of light by stacking a plurality of light emitting materials capable of generating different colors of light such as a red color of light, a green color of light, a blue color of light, and so on. A color filter may be disposed on the light emitting layer 330. The color filter may be selected from a red color filter, a green color filter, and a blue color filter. Alternatively, the color filter may include a yellow color filter, a cyan color filter, and a magenta color filter. The color filter may include a photosensitive resin (or color photoresist), and so on.

The upper electrode 340 may be disposed on the pixel defining layer 310 and the light emitting layer 330. The upper electrode 340 may include a metal, a metal alloy, metal nitride, conductive metal oxide, transparent conductive materials, and so on.

The TFE structure 450 may be disposed on the upper electrode 340. The TFE structure 450 may include the first TFE layer 451, the second TFE layer 452, and the third TFE layer 453. The second TFE layer 452 may be disposed on the first TFE layer 451; and, the third TFE layer 453 may be disposed on the second TFE layer 452. The first TFE layer 451 may be disposed on the upper electrode 340. The first TFE layer 451 may cover the upper electrode 340, and may be disposed as a substantially uniform thickness along a profile of the upper electrode 340. The first TFE layer 451 may prevent the light emitting structure from being deteriorated by the permeation thereto of moisture, water, oxygen, and so on. In addition, the first TFE layer 451 may protect the light emitting structure from damage caused by an external impact. The first TFE layer 451 may or might not include inorganic materials.

The second TFE layer 452 may be disposed on the first TFE layer 451. The second TFE layer 452 may improve the flatness of the OLED device 100 and may protect the light emitting structure. The second TFE layer 452 may or might not include organic materials.

The third TFE layer 453 may be disposed on the second TFE layer 452. The third TFE layer 453 may cover the second TFE layer 452 and may be disposed as a substantially uniform thickness along a profile of the second TFE layer 452. The third TFE layer 453 together with the first TFE layer 451 and the second TFE layer 452 may prevent the light emitting structure from being deteriorated by the permeation thereto of moisture, water, oxygen, and so on. In addition, the third TFE layer 453 together with the first TFE layer 451 and the second TFE layer 452 may protect the light emitting structure from damage caused by an external impact. The third TFE layer 453 may or might not include inorganic materials. Accordingly, the TFE structure 450 including the first TFE layer 451, the second TFE layer 452, and the third TFE layer 453 may be disposed. In addition, the display panel 200 including the substrate 110, the semiconductor element 250, the planarization layer 270, the lower electrode 290, the pixel defining layer 310, the light emitting layer 330, the upper electrode 340, and the TFE structure 450 may be disposed.

Alternatively, the TFE structure 450 may have a five layer structure where the first to fifth TFE layers may be stacked, or a seven layer structure where the first to seventh TFE layers may be stacked.

The touch screen electrode layer 410 may be disposed on the TFE structure 450 (or the display panel 200). The touch screen electrode layer 410 may include a bottom polyethylene terephthalate (PET) film, touch screen electrodes, and a top PET film, and so on. The bottom PET film and/or the top PET film may protect the touch screen electrodes. For example, the top PET film and the bottom PET film may include polyethylene terephthalate (PET), polyethylene naphthalate (PEN), polypropylene (PP), polycarbonate (PC), polystyrene (PS), polysulfone (PSul), polyethyene (PE), polyphthalamide (PPA), polyethersulfone (PES), polyarylate (PAR), polycarbonate oxide (PCO), modified polyphenylene oxide (MPPO), and so on. The touch screen electrodes may have a substantially metal mesh structure. For example, the touch screen electrodes may include carbon nanotube (CNT), transparent conductive oxide (TCO), indium tin oxide (ITO), indium gallium zinc oxide (IGZO), zinc oxide (ZnO), graphene, silver nanowire (AgNW), copper (Cu), chrome (Cr), and so on. Alternatively, the touch screen electrodes may be disposed directly on the TFE structure 450. The bottom PET film may or might not be disposed on the TFE structure 450.

The polarizing layer 430 may be disposed on the touch screen electrode layer 410. The polarizing layer 430 may include a linearly polarized film and a λ/4 phase retardation film. Here, the λ/4 phase retardation film may be disposed on the touch screen electrode layer 410. The λ/4 phase retardation film may convert a phase of the light. For example, the λ/4 phase retardation film may convert the light vibrating up and down or the light vibrating left and right into right-circularly polarized light or left-circularly polarized light, respectively. In addition, the λ/4 phase retardation film may convert the right-circularly polarized light or the left-circularly polarized light into the light vibrating up and down or the light vibrating left and right, respectively. The λ/4 phase retardation film may include a birefringent film containing polymer, an orientation film of a liquid crystal polymer, an alignment layer of a liquid crystal polymer, and so on.

The linearly polarized film may be disposed on the λ/4 phase retardation film. The linearly polarized film may selectively transmit the incident light. For example, the linearly polarized film may transmit the light vibrating up and down or vibrating left and right. The linearly polarized film may include a pattern of horizontal stripes or vertical stripes. When the linearly polarized film includes a pattern of horizontal stripes, the linearly polarized film may block the light vibrating up and down, and may transmit the light vibrating left and right. When the linearly polarized film includes a pattern of vertical stripes, the linearly polarized film may block the light vibrating left and right, and may transmit the light vibrating up and down.

The light transmitted from the linearly polarized film may also be transmitted from the λ/4 phase retardation film. As described above, the λ/4 phase retardation film may convert a phase of the light. For example, when the incident light vibrating up, down, left, and right passes through the linearly polarized film, the linearly polarized film including a pattern of the horizontal stripes may transmit the light vibrating left and right. When the incident light vibrating left and right passes through the λ/4 phase retardation film, the incident light vibrating s left and right may be converted into the left-circularly polarized light. The incident light including the left-circularly polarized light may be reflected at the cathode electrode (e.g., the upper electrode 340) of the display panel 200, and then the incident light may be converted into the right-circularly polarized light. When the incident light including the right-circularly polarized light passes through the λ/4 phase retardation film, the incident light may be converted into the light vibrating up and down. Here, the light vibrating up and down may be blocked by the linearly polarized film including the pattern of horizontal stripes. Accordingly, the incident light may or might not be entirely removed by the linearly polarized film and the λ/4 phase retardation film (i.e., the polarizing layer 430). The linearly polarized film may include iodine-based materials, materials containing dye, polyene-based materials, and so on. Accordingly, the is upper structure 400 including the touch screen electrode layer 410 and the polarizing layer 430 may be disposed.

As illustrated in FIG. 4B, the bending protection layer 460 may be disposed in the peripheral region 40, the bending region 50, and a portion of the pad electrode region 60 on the planarization layer 270. The bending protection layer 460 may protect the connection electrode 212, and may rise in a direction which may be opposite to the third direction D3, a neutral plane of the bending region 50. For example, when the bending region 50 is bent, the connection electrodes might not be broken because the neutral plane of the bending region 50 may be located within a portion where the connection electrodes are disposed. The bending protection layer 460 may or might not include organic materials.

Referring again to FIGS. 4A and 4B, the lower protection film 300 may be disposed in a lower surface of the substrate 110. The lower protection film 300 may protect the display panel 200 from damage caused by an external impact.

The lower protection film 300 may include the first lower protection film pattern 351 and the second lower protection film pattern 352. The first lower protection film pattern 351 may be partially or entirely disposed in the display region 10, and the second lower protection film pattern 352 may be disposed only in the pad electrode region 60 such that a lower surface of the display panel 200 located in the bending region 50 may be exposed. In other words, the lower protection film 300 may expose a lower surface of the display panel 200 in the bending region 50, and the first lower protection film pattern 351 may be spaced apart from the second lower protection film pattern 352. The spaced apart portion may be an opening defined by the lower protection film 300, and a width extending in the second direction D2 of the opening defined by the lower protection film 300 may be less than a width extending in the second direction D2 of an opening defined by the gate insulation layer 150 and the insulating interlayer 190 that expose an upper surface of the display panel 200. The first adhesive layer 302 and the second adhesive layer 304 may be in direct contact with a lower surface of the display panel 200. For example, the first and second adhesive layers 302 and 304 may include optical clear adhesives (OCA), pressure sensitive adhesives (PSA), and so on, including acryl-based adhesives, silicon-based adhesives, urethane-based adhesives, rubber-based adhesives, vinyl ether-based adhesives, and the like. In addition, an antistatic material may be added in the OCA or the PSA. Further, each of the first protection layer 301 and the first adhesive layer 302 may be disposed under the first adhesive layer 302 and the second adhesive layer 304, respectively. For example, each of the first protection layer 301 and the second protection layer 303 may include PET, PEN, PP, PC, PS, PSul, PE, PPA, PES, PAR, PCO, MPPO, and so on.

In a process where the lower protection film 300 is attached to a lower surface of the display panel 200, a release film may be disposed on the lower protection film 300 to protect the first adhesive layer 302 and the second adhesive layer 304. Static electricity may be non-uniformly distributed in the first adhesive layer 302 and the second adhesive layer 304 by a process where the release film is detached from the lower protection film 300. In other words, electric charges located in the release film may migrate to the first adhesive layer 302 and the second adhesive layer 304 when the release film is detached from the lower protection film 300; to and, a relatively large amount of electric charges may be distributed at a portion (e.g., a distal end portion of the lower protection film 300) where the release film is finally (or lastly) detached from the lower protection film 300. An image displayed by the OLED device 100 may be degraded by the non-uniform distribution of the electric charges. In particular, a luminance of light emitted from the display panel 200 may be undesirably high in a portion having the non-uniform distribution of the electric charges.

When the first adhesive layer 302 and the second adhesive layer 304 include the antistatic material, a surface resistance of the first and second adhesive layers 302 and 304 may be decreased. For example, when the first and second adhesive layers 302 and 304 do not include the antistatic material, the surface resistance of the first and second adhesive layers 302 and 304 may be greater than about $1\times10^{13}$ ohm/sq. In contrast, when the first and second adhesive layers 302 and 304 include the antistatic material, a surface resistance of the first and second adhesive layers 302 and 304 may be less than about $1\times10^{11}$ ohm/sq. A weight ratio the antistatic material based on a total weight of the first and second adhesive layers 302 and 304 may be in a range between about 1 wt % and about 3 wt % (of the total weight). Thus, the electric charges may achieve a uniform distribution in the first and second adhesive layers 302 and 304 having a low surface resistance and/or may migrate to a grounded process device. Accordingly, the performance of the OLED device 100 may be improved by reducing or eliminating the problems associated with the presence of static electricity as described in greater detail elsewhere herein.

The thickness of the lower protection film 300 may be in a range between about 85 and about 91 micrometers. the thickness of each of the first and second protection layers 301 and 302 may be in a range between about 74 and about 76 micrometers; and, the thickness of the first and second adhesive layers 302 and 304 may be in a range between about 11 and about 13 micrometers. As illustrated in FIGS. 2A and 2B, the display region 10 may include the second sub-display region 32 and the third sub-display region 33 that have a shape which is bent on an axis with respect with the second direction D2. A neutral plane of the lower protection film 300, the display panel 200, and the upper structure 400 in the second and third sub-display regions 32 and 33 may be located within the display panel 200. That is, the thickness of the lower protection film 300 may be determined such that the neutral plane in the second and third sub-display regions 32 and 33 is located within the display panel 200. For example, when the second and third sub-display regions 32 and 33 are bent, the display panel 200 might not be damaged because the neutral plane of the second and third sub-display regions 32 and 33 is located within the display panel 200.

The antistatic material included in the first and second adhesive layers 302 and 304 may include carbon nanotube, graphene, metal oxide, conductive polymer, and similar materials. The metal oxide may include zinc oxide (ZnO), antimony tin oxide (ATO), indium tin oxide (ITO), and the like. In addition, the conductive polymer may include polyfluorene, polyphenylene, polypyrene, polyazulene, polynaphthalene, polyacetylene (PAC), poly-p-phenylene vinyl (PPV), polypyrrole (PPY), polycarbazole, polyindole, polyzepine, poly (thienylene vinylene), polythiophene, Polyaniline (PANI), poly (thiophene), poly (p-phenylene sulfide), poly (3,4-ethylenedioxythiophene) (3,4-ethylenedioxythiophene) (PEDOT), poly (3,4-ethylenedioxythiophene) (PEDOT:PSS) doped with poly (styrenesulfonate)-tetramethacrylate (PEDOT-TMA), polyfuran, and similar materials. These materials may be used alone or in a suitable combination thereof.

As will be described in greater detail below, the OLED device 100 may include the first and second adhesive layers 302 and 304, including an antistatic material; and, the OLED device 100 may be protected from static electricity generated due to a detachment of a release film from the lower protection film 300. In addition, as the thickness of the lower protection film 300 is known, the neutral plane of the display panel 200 and the upper structure 400 in the second and third sub-display regions 32 and 33 of the display panel 200 having a bent shape may be located within the display panel 200. Accordingly, although a portion of the display region 10 may be bent, the display panel 200 might not be damaged due to the inclusion of the neutral plane within the display panel 200.

Figure 5B:
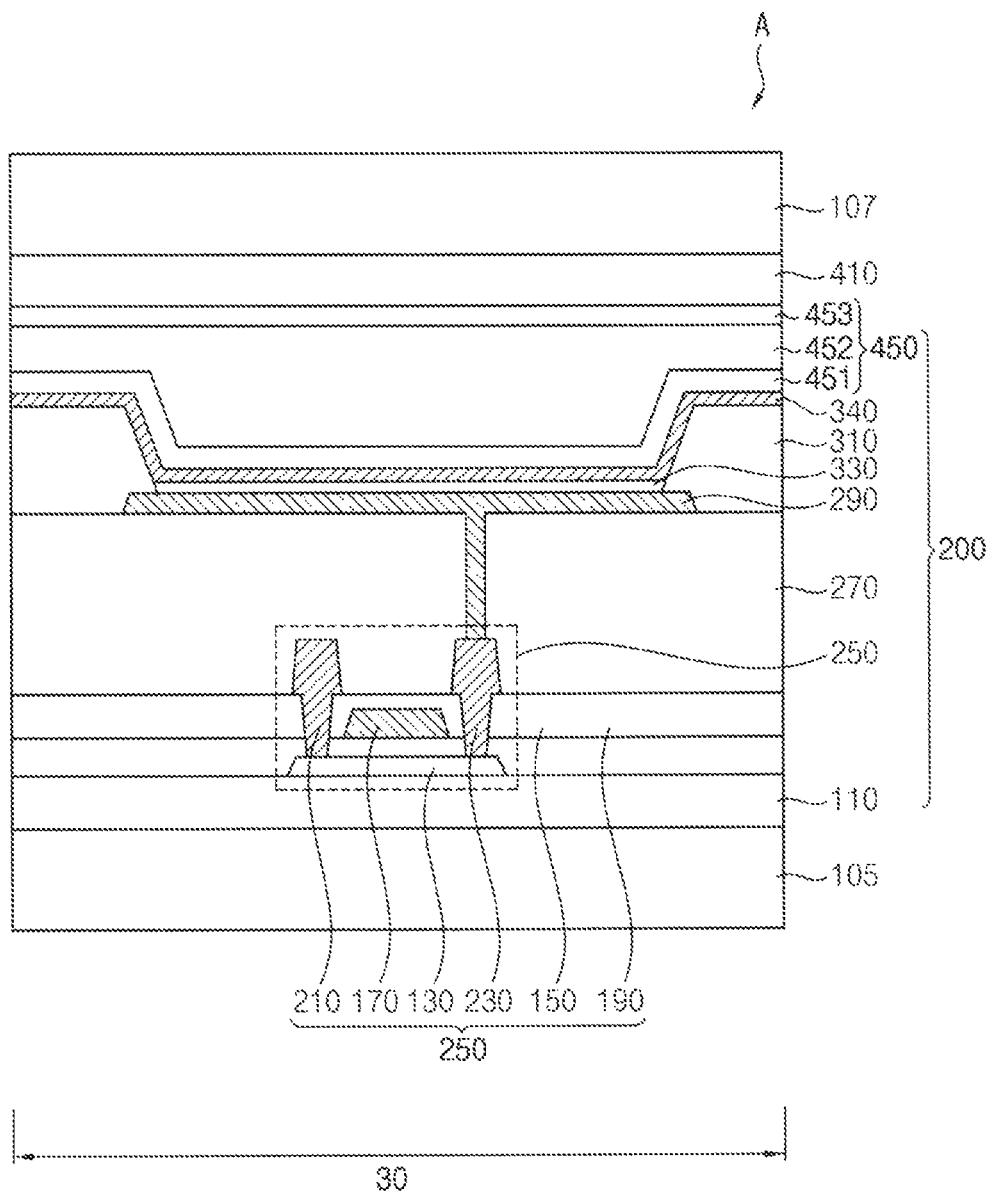
Figure 5C:
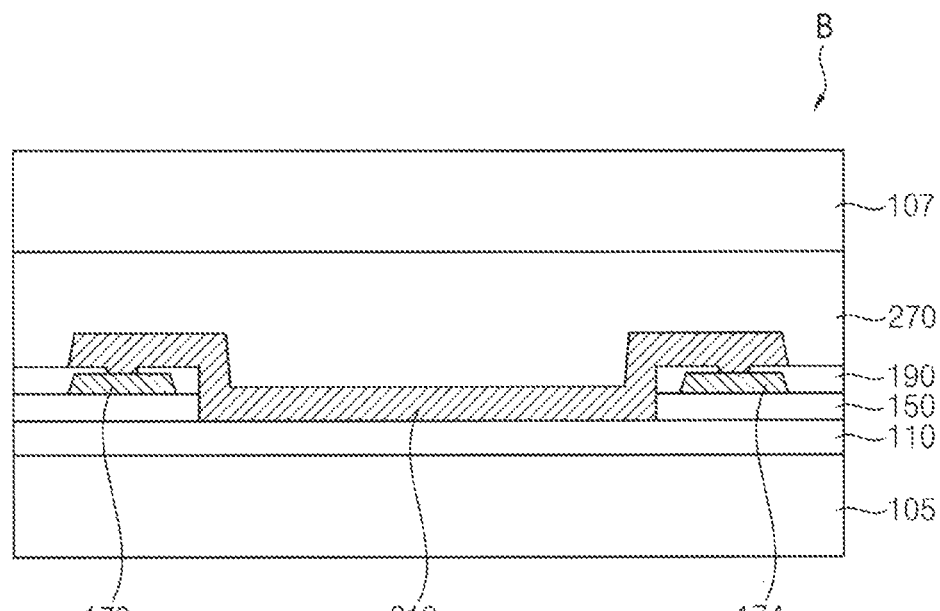

Referring to exemplary method stages shown in FIGS. 5A, 5B, and 5C, a display panel 200, a lower film 105 disposed on a lower surface of the display panel 200, a touch screen electrode layer 410 disposed in a light emitting region 30 on the display panel 200, and an upper film 107 disposed on the display panel 200 may be provided. For example, when a mother substrate including a plurality of display panels is cut by a cell cutting process, the upper film 107 may be disposed to protect an upper surface of the display panels and the lower film 105 may be disposed to protect a lower surface of the mother substrate. FIG. 5A illustrates a preliminary OLED device 100 after the cell cutting and pad cutting.

As illustrated in FIGS. 5B and 5C, a substrate 110 including transparent materials may be located on the lower film 105. The substrate 110 may be formed using a flexible transparent material such as a flexible transparent resin substrate (e.g., a polyimide substrate).

A buffer layer may be formed on the substrate 110. The buffer layer may be formed on a part of or the entire substrate 110. The buffer layer may prevent the diffusion of metal atoms and/or impurities from the substrate 110 into the semiconductor element 250. Additionally, the buffer layer may control a rate of a heat transfer in a crystallization process for forming the active layer 130, thereby obtaining a substantially uniform active layer 130. Furthermore, the buffer layer may improve a surface flatness of the substrate 110 when a surface of the substrate 110 is relatively irregular. The buffer layer may be formed using a silicon compound, a metal oxide, and similar materials.

An active layer 130 may be formed on the substrate 110, and the active layer 130 may be formed using an oxide semiconductor, an inorganic semiconductor, an organic semiconductor, and similar materials.

A gate insulation layer 150 may be formed on the active layer 130. The gate insulation layer 150 may cover the active layer 130, and may be formed on the substrate 110. In addition, the gate insulation layer 150 may include an opening that exposes an upper surface of the substrate 110 in a bending region 50. The gate insulation layer 150 may be formed using silicon compound, metal oxide, and similar materials.

A gate electrode 170 may be formed on a portion of the gate insulation layer 150 under which the active layer 130 may be located. The gate electrode 170 may be formed using a metal, a metal alloy, metal nitride, a conductive metal oxide, transparent conductive materials, and similar materials.

A first conductive pattern 172 may be formed in a peripheral region 40 on the gate insulation layer 150. The first conductive pattern 172 may include a data signal wiring, a scan signal wiring, a light emission signal wiring, a power supply wiring, and other components. A second conductive pattern 174 may be formed in the pad electrode region 60 on the gate insulation layer 150. The second conductive pattern 174 may be electrically connected to a pad electrode 470. The first conductive pattern 172, the second conductive pattern 174, and the gate electrode 170 may be simultaneously formed using the same material.

An insulating interlayer 190 may be formed on the gate electrode 170, the first conductive pattern 172 and the second conductive pattern 174. The insulating interlayer 190 may cover the gate electrode 170, the first conductive pattern 172 and the second conductive pattern 174, and may be formed on the gate insulation layer 150. In addition, the insulating interlayer 190 may include an opening that exposes an upper surface of the substrate 110 in the bending region 50. The insulating interlayer 190 may be formed using a silicon compound, a metal oxide, and similar materials.

A source electrode 210 and a drain electrode 230 may be formed on the insulating interlayer 190. The source electrode 210 may be in direct contact with a first side of the active layer 130 via a contact hole formed by removing a portion of the gate insulation layer 150 and the insulating interlayer 190. The drain electrode 230 may be in direct contact with a second side of the active layer 130 via a contact hole formed by removing another portion of the gate insulation layer 150 and the insulating interlayer 190. The source electrode 210 and the drain electrode 230 may be formed using a metal, an alloy, a metal nitride, a conductive metal oxide, transparent conductive materials, and similar materials. These may be used alone or in a suitable combination thereof. Each of the source and drain electrodes 210 and 230 may or might not have a multi-layered structure. Accordingly, a semiconductor element 250 including the active layer 130, the gate insulation layer 150, the gate electrode 170, the insulating interlayer 190, the source electrode 210, and the drain electrode 230 may be formed.

A connection electrode 212 may be formed in a portion of the peripheral region 40, the bending region 50, and the a portion of the pad electrode region 60 on the insulating interlayer 190 to overlap the first conductive pattern 172 and the second conductive pattern 174. The connection electrode 212 may be in contact with the first conductive pattern 172 via a contact hole formed by removing a portion of the insulating interlayer 190 located in the peripheral region 40, and may be in contact with the second conductive pattern 174 via a contact hole formed by removing a portion of the insulating interlayer 190 located in the pad electrode region 60. The connection electrode 212, the source electrode 210, and the drain electrode 230 may be simultaneously formed using the same material.

A planarization layer 270 may be formed on the connection electrode 212, the source electrode 210, and the drain electrode 230. The planarization layer 270 may cover the connection electrode 212, the source electrode 210, and the drain electrode 230, and may be formed on a part of or the entire insulating interlayer 190. The planarization layer 270 may be formed with a thickness sufficient to cover the connection electrode 212 and the source and drain electrodes 210 and 230. The planarization layer 270 may have a substantially flat upper surface; and, a planarization process may be further performed on the planarization layer 270 to obtain a flat upper surface of the planarization layer 270. The planarization layer 270 may or might not be formed using organic materials.

A lower electrode 290 may be formed on the planarization layer 270. The lower electrode 290 may be in contact with the drain electrode 230 via a contact hole formed by removing a portion of the planarization layer 270. The lower electrode 290 may be formed using a metal, a metal alloy, a metal nitride, a conductive metal oxide, transparent conductive materials, and similar materials. These may be used alone or in a suitable combination thereof. The lower electrode 290 may or might not have a multi-layered structure.

A pixel defining layer 310 may be formed on the planarization layer 270, and may expose a portion of the lower electrode 290. The pixel defining layer 310 may expose the bending region 50 and the pad electrode region 60. The pixel defining layer 310 may or might not be formed using organic materials.

A light emitting layer 330 may be formed in an area corresponding to where the portion of the lower electrode 290 may be exposed. The light emitting layer 330 may be formed using at least one of light emitting materials capable of generating different colors of light (e.g., a red color, a blue color, and a green color, and so on) according to sub-pixels. Alternatively, the light emitting layer 330 may generate a generally white color of light by stacking a plurality of light emitting materials capable of generating different colors of light such as a red color, a green color, a blue color, and so on. A color filter may be disposed on the light emitting layer 330. The color filter may include at least one selected from a red color filter, a green color filter, and a blue color filter. Alternatively, the color filter may include a yellow color filter, a cyan color filter, and a magenta color filter. The color filter may be formed using a photosensitive resin (or color photoresist), etc.

An upper electrode 340 may be formed on the pixel defining layer 310 and the light emitting layer 330. The upper electrode 340 may be formed using a metal, a metal alloy, a metal nitride, a conductive metal oxide, transparent conductive materials, and similar materials.

A first TFE layer 451 may be formed on the upper electrode 340. The first TFE layer 451 may cover the upper electrode 340, and may be formed with a substantially uniform thickness along a profile of the upper electrode 340. The first TFE layer 451 may prevent a light s emitting structure (e.g., the semiconductor element 250, the lower electrode 290, the light emitting layer 330, the upper electrode 340, and so on) from being deteriorated by the permeation of moisture, water, oxygen, and so forth. In addition, the first TFE layer 451 may protect the light emitting structure from damage caused by an external impact. The first TFE layer 451 may or might not be formed using one or more inorganic materials.

A second TFE layer 452 may be formed on the first TFE layer 451. The second TFE layer 452 may improve the flatness of an OLED device 100, and may protect the light emitting structure. The second TFE layer 452 may be formed using organic materials.

A third TFE layer 453 may be formed on the second TFE layer 452. The third TFE layer 453 may cover the second TFE layer 452, and may be formed with a substantially uniform thickness along a profile of the second TFE layer 452. The third TFE layer 453 together with the first TFE layer 451 and the second TFE layer 452 may prevent the light emitting structure from being deteriorated by the permeation thereto of moisture, water, oxygen, and similar materials. In addition, the third TFE layer 453 together with the first TFE layer 451 and the second TFE layer 452 may protect the light emitting structure from damage caused by an external impact. The third TFE layer 453 may or might not be formed using inorganic materials. Accordingly, a TFE structure 450 including the first TFE layer 451, the second TFE layer 452, and the third TFE layer 453 may be formed. In addition, a display panel 200 including the substrate 110, the semiconductor element 250, the planarization layer 270, the lower electrode 290, the pixel defining layer 310, the light emitting layer 330, the upper electrode 340, and the TFE structure 450 may be formed.

A touch screen electrode layer 410 may be formed on the TFE structure 450 (or the display panel 200). The touch screen electrode layer 410 may include a bottom PET film, touch screen electrodes, a top PET film, and similar materials. The bottom PET film and/or the top PET film may protect the touch screen electrodes. The touch screen electrodes may have a substantially metal mesh structure. Alternatively, the touch screen electrodes may be formed directly on the TFE structure 450. Thus, the bottom PET film might not be formed on the TFE structure 450.

Figure 6:
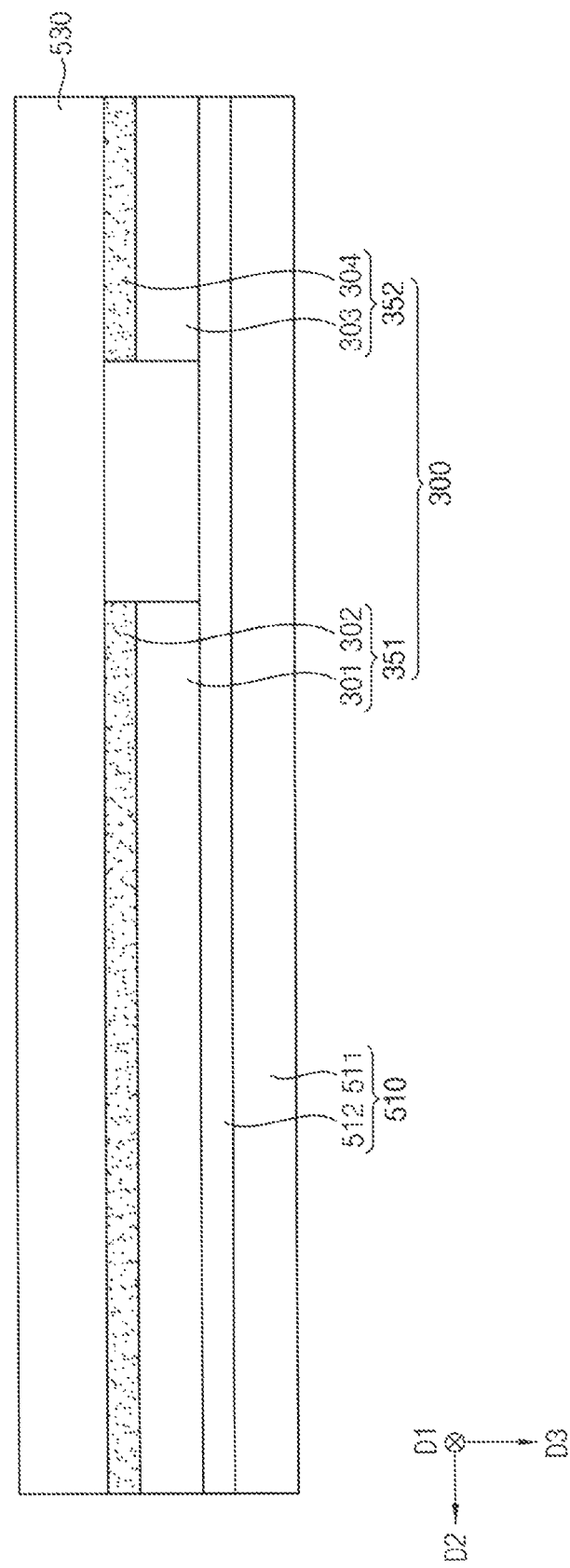

Referring to FIG. 6, a lower protection film 300, a release film 530 disposed on the lower protection film 300, and a carrier film 510 disposed a lower surface of the lower protection film 300 may be provided. The lower protection film 300 may protect a lower surface of the display panel 200; and, the release film 530 may protect an adhesive layer (e.g., first and second adhesive layers 302 and 304) of the lower protection film 300. In addition, the carrier film 510 may support the lower protection film 300.

The lower protection film 300 may include a first lower protection film pattern 351 and a second lower protection film pattern 352. The first lower protection film pattern 351 may include a first protection layer 301 and a first adhesive layer 302; and, the second lower protection film pattern 352 may include a second protection layer 303 and a second adhesive layer 304. The release film 530 may include a PET film where silicon is laminated in a surface of the PET film; and, the carrier film 510 may include an adhesive layer 511 including an antistatic material and a PET film 512. An adhesive force of the adhesive layer 511 may be less than that of the first and second adhesive layers 302 and 304.

Figure 7:
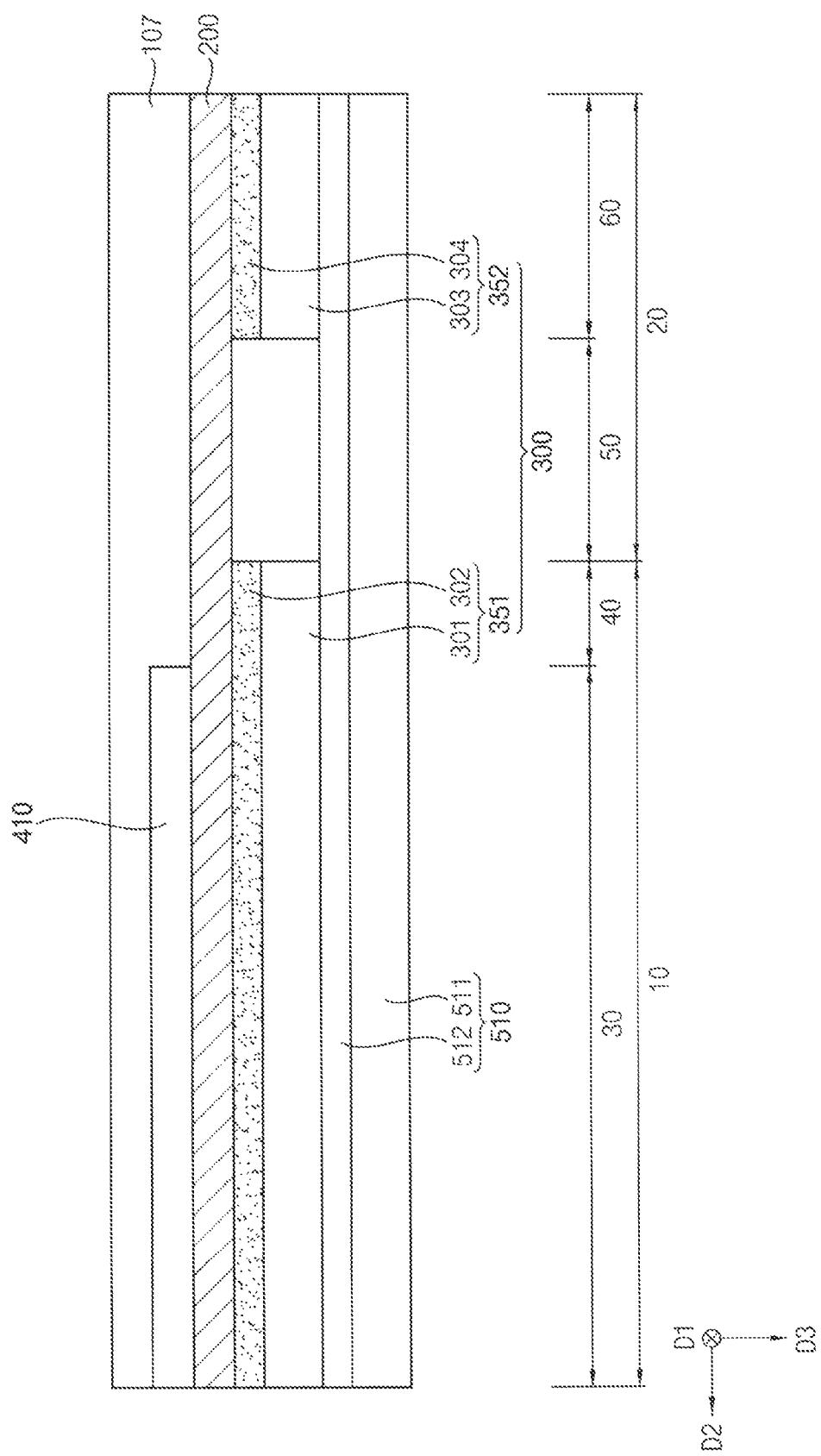

Referring to FIG. 7, after the lower film 105 located on a lower surface of the display panel 200 is removed from the display panel 200, the lower protection film 300 and the carrier film 510 may be formed on a lower surface of the display panel 200 by removing the release film 530 on the lower protection film 300.

The first lower protection film pattern 351 of the lower protection film 300 may be formed in the display region 10; and, the second lower protection film pattern 352 may be formed in the pad electrode region 60 such that a lower surface of the display panel 200 located in the bending region 50 is exposed. In other words, the lower protection film 300 may expose a lower surface of the display panel 200 in the bending region 50; and, the first lower protection film pattern 351 may be spaced apart from the second lower protection film pattern 352. In addition, the first adhesive layer 302 and the second adhesive layer 304 may be in direct contact with a lower surface of the display panel 200, and may include an antistatic material. Further, each of the first protection layer 301 and the first adhesive layer 302 may be located under the first adhesive layer 302 and the second adhesive layer 304, respectively. For example, the first and second adhesive layers 302 and 304 may be formed using the OCA, the PSA, and similar materials, including acryl-based adhesives, silicon-based adhesives, urethane-based adhesives, rubber-based adhesives, vinyl ether-based adhesives, and the like. In addition, an antistatic material may be added in the OCA or the PSA. Further, each of the first protection layer 301 and the second protection layer 303 may be formed using PET, PEN, PP, PC, PS, PSul, PE, PPA, PES, PAR, PCO, MPPO, etc.

When the lower protection film 300 is attached to a lower surface of the display panel 200, static electricity may be non-uniformly distributed in the first adhesive layer 302 and the second adhesive layer 304 when the release film 530 is detached from the lower protection film 300. In other words, electric charges located in the release film 530 may migrate to the first adhesive layer 302 and the second adhesive layer 304 when the release film 530 is detached from the lower protection film 300; and, a relatively large amount of electric charges may be distributed at a portion (e.g., a distal end portion of the lower protection film 300) where the release film is detached from the lower protection film 300. An image displayed by the OLED device 100 may be degraded by the non-uniform distribution of the electric charges. In particular, a luminance of a light emitted from the display panel 200 may be undesirably high in a portion having the non-uniform distribution of the electric charges.

When the first adhesive layer 302 and the second adhesive layer 304 include the antistatic material, a surface resistance of the first and second adhesive layers 302 and 304 may be decreased. For example, when the first and second adhesive layers 302 and 304 do not include the antistatic material, a surface resistance of the first and second adhesive layers 302 and 304 may be greater than about $1\times10^{13}$ ohm/sq. In contrast, when the first and second adhesive layers 302 and 304 include the antistatic material, a surface resistance of the first and second adhesive layers 302 and 304 may be less than about $1\times10^{11}$ ohm/sq. The weight ratio the antistatic material based on a total weight of the first and second adhesive layers 302 and 304 may be in a range between about 1 wt % and about 3 wt % (of the total weight). Thus, the electric charges may achieve a uniform distribution in the first and second adhesive layers 302 and 304 having a low surface resistance and/or may migrate to a grounded process device. Accordingly, the performance of the OLED device 100 may be improved as described herein.

The thickness of the lower protection film 300 may be in a range between about 85 and about 91 micrometers. The thickness of each of the first and second protection layers 301 and 302 may be in a range between about 74 and about 76 micrometers; and, the thickness of the first and second adhesive layers 302 and 304 may be in a range between about 11 and about 13 micrometers. As illustrated in FIGS. 2A and 2B, the display region 10 may include the second sub-display region 32 and the third sub-display region 33 that have a shape which is bent on an axis with respect with the second direction D2. The neutral plane of the lower protection film 300, the display panel 200, and the upper structure 400 in the second and third sub-display regions 32 and 33 may be located within the display panel 200. That is, a thickness of the lower protection film 300 may be determined such that the neutral plane in the second and third sub-display regions 32 and 33 is located within the display panel 200. For example, when the second and third sub-display regions 32 and 33 are bent, the display panel 200 might not be damaged because a neutral plane of the second and third sub-display regions 32 and 33 is located within the display panel 200.

The antistatic material included in the first and second adhesive layers 302 and 304 may include a carbon nanotube, a graphene, a metal oxide, a conductive polymer, and similar materials. The metal oxide may include ZnO, ATO, ITO, etc. In addition, the conductive polymer may include polyfluorene, polyphenylene, polypyrene, polyazulene, polynaphthalene, PAC, PPV, PPY, polycarbazole, polyindole, polyzepine, poly (thienylene vinylene), polythiophene, PANI, poly (thiophene), poly (p-phenylene sulfide), PEDOT, PEDOT:PSS doped with PEDOT-TMA, polyfuran, or the like. These may be used alone or in a suitable combination thereof.

Figure 8:
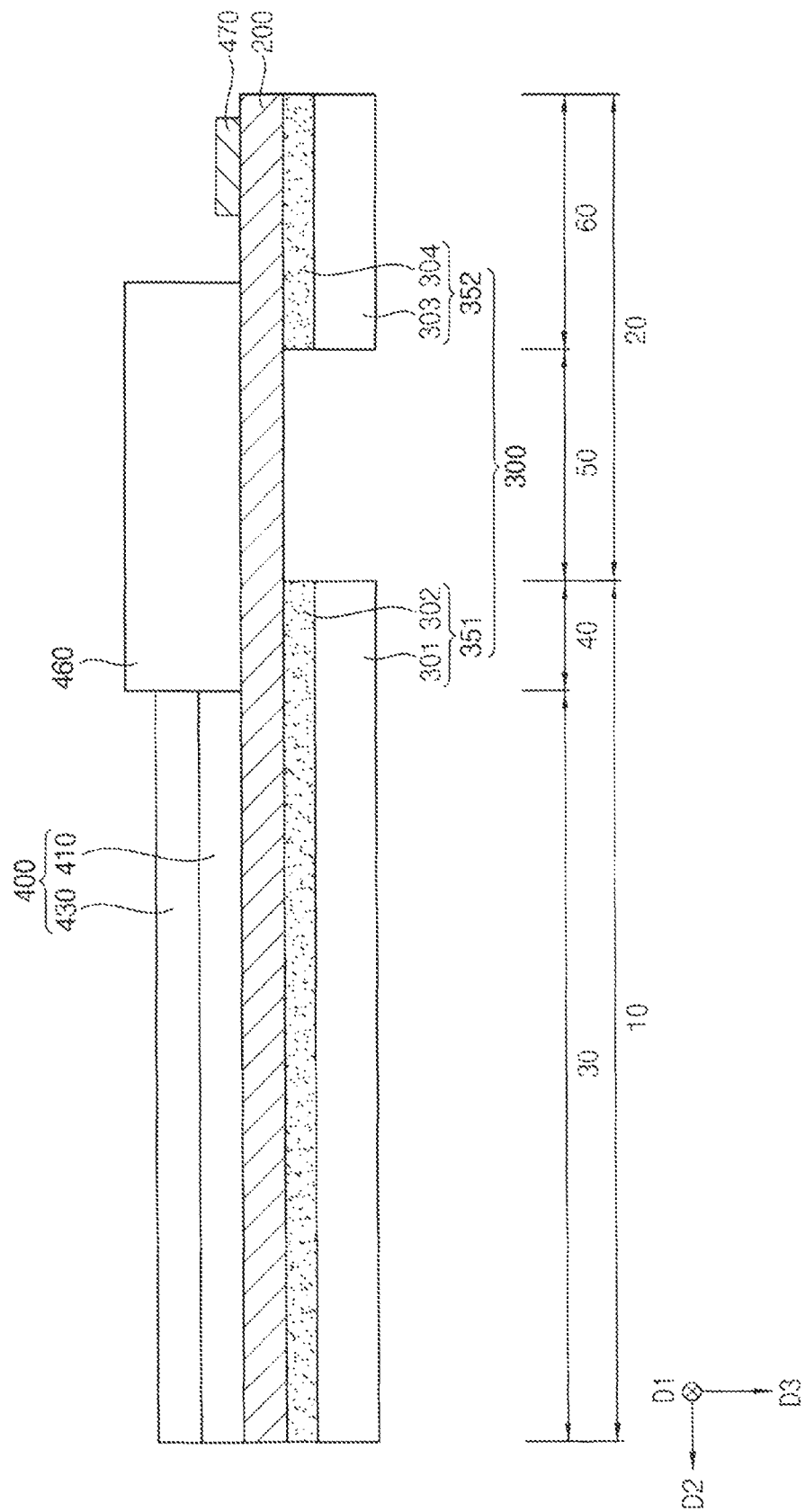

Referring FIG. 8, the upper film 107 may be removed on the display panel 200, and a polarizing layer 430 may be formed on the touch screen electrode layer 410. Accordingly, an upper structure 400 including the touch screen electrode layer 410 and the polarizing layer 430 may be formed. In addition, the carrier film 510 may be removed on a lower surface of the lower protection film 300. Accordingly, the OLED device 100 of FIG. 3A may be manufactured.

Figure 9:
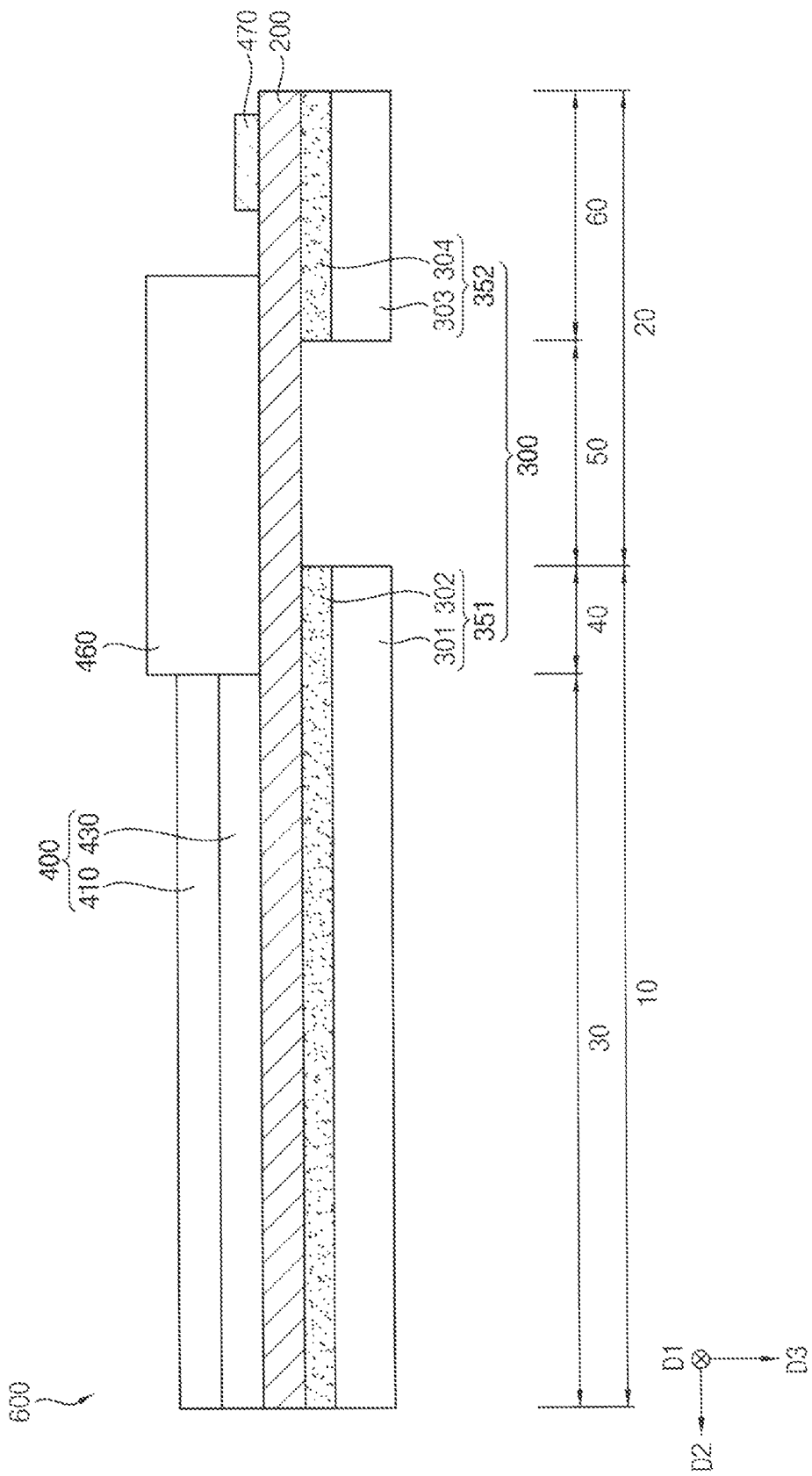
FIG. 9 is a cross-sectional view of a second embodiment of an OLED device constructed according to the principles of the invention.

An OLED device 600 illustrated in FIG. 9 may have a configuration substantially the same as, or similar to, that of the OLED device 100 described with reference to FIGS. 1 to 4B. In FIG. 9, detailed descriptions for elements that are substantially the same as, or similar to, elements described above with reference to FIGS. 1 to 4B may not be repeated.

Referring to FIG. 9, an OLED device 600 may include a display panel 200, a lower protection film 300, an upper structure 400, a bending protection layer 460, a pad electrode 470, and other components. The lower protection film 300 may include a first lower protection film pattern 351 and a second lower protection film pattern 352. In addition, the first lower protection film pattern 351 may include a first protection layer 301 and a first adhesive layer 302; and, the second lower protection film pattern 352 may include a second protection layer 303 and a second adhesive layer 304. Further, the upper structure 400 may include a polarizing layer 430 and a touch screen electrode layer 410.

As described above, the display panel 200 may have a display region 10 and a pad region 20. The display region 10 may include a light emitting region 30 and a peripheral region 40, and the pad region 20 may include a bending region 50 and a pad electrode region 60.

The upper structure 400 may be disposed in the display region 10 on the display panel 200. The polarizing layer 430 may be disposed on the display panel 200; and, the touch screen electrode layer 410 may be disposed on the polarizing layer 430.

The lower protection film 300 may be disposed on a lower surface of the display panel 200. The lower protection film 300 may include the first lower protection film pattern 351 that may be disposed in the display region 10 and the second lower protection film pattern 352 that may be disposed in the pad electrode region 60 such that a lower surface of the display panel 200 located in the bending region 50 may be exposed. In other words, the lower protection film 300 may include an opening that exposes a lower surface of the display panel 200 in the bending region 50. In addition, the first adhesive layer 302 and the second adhesive layer 304 may be in direct contact with a lower surface of the display panel 200, and may include antistatic materials. Further, each of the first protection layer 301 and the second protection layer 303 may be disposed under the first adhesive layer 302 and the second adhesive layer 304, respectively.

The first lower protection film pattern 351 may further include a light blocking material. The light blocking material may be added to the first protection layer 301 and/or the first adhesive layer 302 of the first lower protection film pattern 351. For example, the light blocking material may include at least one of carbon black, titanium nitride oxide, titanium black, phenylene black, aniline black, cyanine black, and nigrosine acid black.

After the OLED device 600 is manufactured, a black film may be additionally disposed on a lower surface of the OLED device 600 (e.g., a lower surface of the lower protection film 300). The black film may prevent pixels P disposed in the inside of the display panel 200 from being visible to a user of the OLED device 600. When the first lower protection film pattern 351 includes the light blocking material, the first lower protection film pattern 351 may serve as the black film. Accordingly, a manufacturing cost of the OLED device 600 may be reduced because the black film might not need to be disposed on a lower surface of the OLED device 600.

Figure 10:
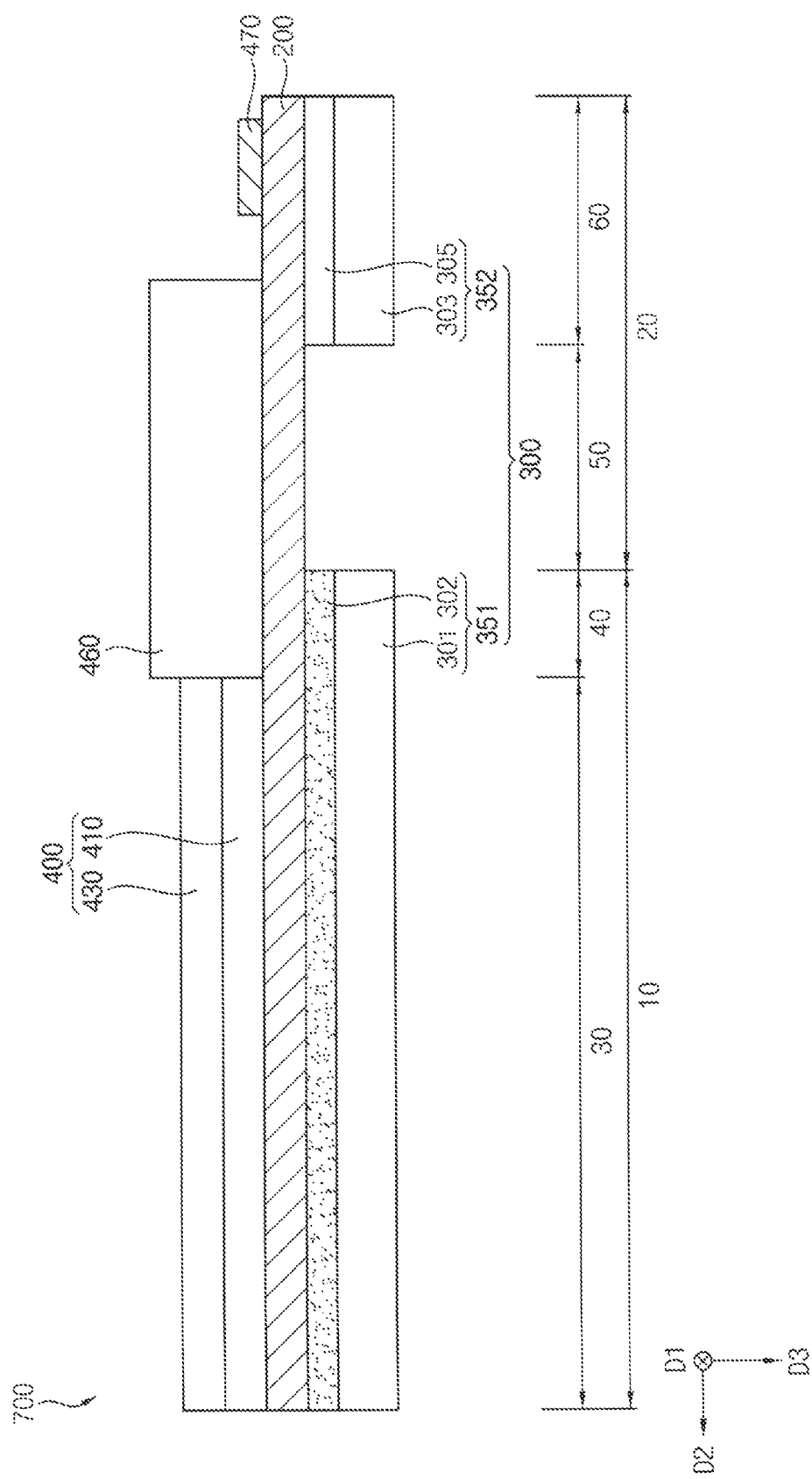
FIG. 10 is a cross-sectional view of a third embodiment of an OLED device constructed according to the principles of the invention.

An OLED device 700 illustrated in FIG. 10 may have a configuration substantially the same as, or similar to, that of an OLED device 100 described with reference to FIGS. 1 to 4B except for the inclusion a second adhesive layer 305. In FIG. 10, detailed descriptions for elements that are substantially the same as, or similar to, elements described above with reference to FIGS. 1 to 4B may not be repeated.

Referring to FIG. 10, an OLED device 700 may include a display panel 200, a lower protection film 300, an upper structure 400, a bending protection layer 460, a pad electrode 470, and other components. The lower protection film 300 may include a first lower protection film pattern 351 and a second lower protection film pattern 352. In addition, the first lower protection film pattern 351 may include a first protection layer 301 and a first adhesive layer 302; and, the second lower protection film pattern 352 may include a second protection layer 303 and a second adhesive layer 305. Further, the upper structure 400 may include a polarizing layer 430 and a touch screen electrode layer 410.

The lower protection film 300 may be disposed on a lower surface of the display panel 200. The lower protection film 300 may include the first lower protection film pattern 351 disposed in the display region 10 and the second lower protection film pattern 352 disposed in the pad electrode region 60 such that a lower surface of the display panel 200 located in the bending region 50 is exposed. In other words, the lower protection film 300 may include an opening that exposes a lower surface of the display panel 200 in the bending region 50. In addition, the first adhesive layer 302 and the second adhesive layer 305 may be in direct contact with a lower surface of the display panel 200, and, in some embodiments, only the first adhesive layer 302 includes antistatic materials. That is, the second adhesive layer 305 might not include the antistatic material. Further, each of the first protection layer 301 and the second protection layer 303 may be disposed under the first adhesive layer 302 and the second adhesive layer 305, respectively.

When the lower protection film 300 is attached to a lower surface of the display panel 200, a release film may be disposed on the lower protection film 300 to protect the first adhesive layer 302 and the second adhesive layer 305. Static electricity may be non-uniformly distributed in the first adhesive layer 302 and the second adhesive layer 305 as the release film is detached from the lower protection film 300. In other words, electric charges located in the release film may migrate to the first adhesive layer 302 and the second adhesive layer 305 as the release film is detached from the lower protection film 300; and, a relatively large amount of electric charges may be distributed at a location where the release film is finally completely detached from the lower protection film 300. A displayed image of the OLED device 700 may be degraded by the non-uniform distribution of the electric charges. In particular, a luminance of light emitted from the display panel 200 may be undesirably high in a portion of the display having the non-uniform distribution of the electric charges. Accordingly, because a defect in the performance of the OLED device 700 caused by the non-uniform distribution of the electric charges does not occur in the pad electrode region 60 where the second adhesive layer 304 is disposed, the antistatic material may be omitted in the second adhesive layer 305. As a result, a process for adding the antistatic material in the second adhesive layer 305 may also be omitted. Accordingly, the cost of the lower protection film 300 may be reduced because the antistatic material may be included in a portion of the lower protection film 300 rather than in the second adhesive layer 305, and the manufacturing cost of the OLED device 700 having the antistatic material may also be decreased.

An OLED device 800 illustrated in FIG. 11 may have a configuration substantially the same as or similar to that of an OLED device 100 described with reference to FIGS. 1 to 4B except for the inclusion of an adhesive layer 306. In FIG. 11, detailed descriptions for elements that are substantially the same as, or similar to, elements described with reference to FIGS. 1 to 4B may not be repeated.

Referring to FIG. 11, an OLED device 800 may include a display panel 200, a lower protection film 300, an upper structure 400, a bending protection layer 460, a pad electrode 470, and other components. The lower protection film 300 may include a first protection layer s 301, a second protection layer 303, and an adhesive layer 306. Further, the upper structure 400 may include a polarizing layer 430 and a touch screen electrode layer 410.

The lower protection film 300 may be disposed on a lower surface of the display panel 200. The lower protection film 300 may define a groove in the bending region 50.

The adhesive layer 306 may be partially or entirely disposed on a lower surface of the display panel 200. The first protection layer 301 may be disposed in the display region 10, and the second protection layer 303 may be disposed in the pad electrode region 60 defining the groove there between such that a lower surface of the adhesive layer 306 located in the bending region 50 is exposed in the groove. The first protection layer 301 and the second protection layer 303 may be spaced apart from each other on the adhesive layer 306 to define the groove there between.

When the lower protection film 300 is attached to a lower surface of the display panel 200, the lower protection film 300 may be partially or entirely disposed on a lower surface of the display panel 200; and, a protection layer removal pattern located in the bending region 50 may be removed from the adhesive layer 306 before the bending region 50 is bent. To prevent impurities from penetrating an empty space defined between the first protection layer 301 and the second protection layer 303 in a manufacturing process, the protection layer removal pattern may be disposed on the adhesive layer 306, and the protection layer removal pattern may be removed before the bending region 50 is bent. Alternatively, in a process for removing the protection layer removal pattern, a portion of the adhesive layer 306 may be simultaneously removed. That is, at least a portion of the adhesive layer 306 may be disposed on a lower surface of the display panel 200 that is located in the bending region 50.

An OLED device 900 illustrated in FIG. 12 may have a configuration substantially the same as, or similar to, that of the OLED device 100 described with reference to FIGS. 1 to 4B, except for the inclusion of an antistatic layer 307. In FIG. 12, detailed descriptions for elements that are substantially the same as, or similar to, elements described with reference to FIGS. 1 to 4B may not be repeated.

Referring to FIG. 12, an OLED device 900 may include a display panel 200, a lower protection film 300, an upper structure 400, a bending protection layer 460, a pad electrode 470, and similar components. The lower protection film 300 may include a first lower protection film pattern 351, a second lower protection film pattern 352, and the antistatic layer 307. In addition, the first lower protection film pattern 351 may include a first protection layer 301 and a first adhesive layer 302; and, the second lower protection film pattern 352 may include a second protection layer 303 and a second adhesive layer 304. Further, the upper structure 400 may include a polarizing layer 430 and a touch screen electrode layer 410.

The lower protection film 300 may be disposed on a lower surface of the display panel 200. The lower protection film 300 may include the first lower protection film pattern 351 that is disposed in the display region 10, the second lower protection film pattern 352 that is disposed in the pad electrode region 60 such that a lower surface of the display panel 200 located in the bending region 50 is exposed there between, and the antistatic layer 307 that is disposed under the first lower protection film pattern 351 and the second lower protection film pattern 352. In other words, an opening in the lower protection film 300 may expose a lower surface of the display panel 200 in the bending region 50. In addition, the first adhesive layer 302 and the second adhesive layer 304 may be in direct contact with a lower surface of the display panel 200, and may include antistatic materials. Further, each of the first protection layer 301 and the second protection layer 303 may be disposed under the first adhesive layer 302 and the second adhesive layer 304, respectively. The antistatic layer 307 including an antistatic material may be disposed under the first protection layer 301 and under the second protection layer 303.

When a carrier film 510 is removed from the lower protection film 300, electric charges located in the carrier film 510 may migrate to the antistatic layer 307. These electric charges achieve a uniform distribution in the antistatic layer 307 having a reduced surface resistance or may migrate to a grounded process device.

The inventive concepts described herein may be applied to various display devices including an organic light emitting display device. For example, the inventive concepts described herein may be applied to a vehicle-display device, a ship-display device, an aircraft-display device, portable communication devices, display devices for information transfer, a medical-display device, and similar devices.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. An organic light emitting display (OLED) device, comprising:
   a display panel having a display region where a plurality of pixels are disposed and a pad region where pad electrodes that are electrically connected to an external device are disposed, the pad region located at a side of the display region, the display panel being configurable to have curved shape where a flexible portion of the display region is bent;
   an upper structure in the display region of the display panel; and
   a lower protection film on a lower surface of the display panel, the lower protection film comprising:
      an adhesive layer in direct contact with the lower surface of the display panel, the adhesive layer including an antistatic material; and
      a protection layer under the adhesive layer,
   wherein the pad region comprises:
      a bending region located in a first portion of the pad region that is adjacent to the display region; and
      a pad electrode region where the pad electrodes are disposed in a second portion of the pad region,
   wherein the lower protection film comprises:
      a first lower protection film pattern disposed in the display region; and
      a second lower protection film pattern disposed in the pad electrode region of the pad region such that the portion of the lower surface of the display panel that is located in the bending region is exposed, and
   wherein the antistatic material is included in the first lower protection film pattern, and the second lower protection film pattern does not include the antistatic material.

2. The OLED device of claim 1, wherein the display region comprises:
   a first sub-display region located in a center of the display region, the first sub-display region having opposed lateral portions;
   second and third sub-display regions, with the second sub-display region located at one of the opposed lateral portions of the first sub-display region and the third sub-display region located at the other opposed lateral portion, the second and third sub-display regions being configured to have a shape that is bent on an axis with respect to a second direction, the second direction being perpendicular to a first direction;
   a fourth sub-display region located adjacent to the second sub-display region, the fourth sub-display region extending in a third direction that is orthogonal to both the first direction and the second direction; and
   a fifth sub-display region located adjacent to the third sub-display region, the fifth sub-display region extending in the third direction.

3. The OLED device of claim 2, wherein the second and fourth sub-display regions and the third and fifth sub-display regions are symmetrical to each other with respect to the first sub-display region.

4. The OLED device of claim 2, wherein the display region comprises:
   a light emitting region configured to emit light; and
   a peripheral region surrounding the light emitting region,
   wherein the first sub-display region, the second sub-display region, and the third sub-display region are located in the light emitting region, and the fourth sub-display region and the fifth sub-display region are located in the peripheral region.

5. The OLED device of claim 4, wherein the adhesive layer is disposed under the substrate that is located in the first, second, third, fourth, and fifth sub-display regions or under substantially the entire substrate that is located in the first, second, third, fourth, and fifth sub-display regions.

6. The OLED device of claim 5, wherein a neutral plane of the adhesive layer and the protection layer, the display panel, and an upper structure in the second and third sub-display regions is located within the display panel.

7. The OLED device of claim 6, wherein a thickness of the adhesive layer is in a range between about 11 and about 15 micrometers, and a thickness of the protection layer is in a range between about 74 and about 76 micrometers.

8. The OLED device of claim 4, further comprising a plurality of wirings disposed in the peripheral region.

9. The OLED device of claim 1, wherein the pad electrode region and the bending region are defined as a pad region, and wherein the bending region is located in a first portion of the pad region that is adjacent to the display region, and the pad electrode region is located in a second portion of the pad region.

10. The OLED device of claim 9, further comprising:
a bending protection layer in a portion of the display region, the bending region, and a portion of the pad electrode region; and
connection electrodes between the bending protection layer and the substrate, the connection electrodes electrically connecting the pixels and the pad electrodes.

11. The OLED device of claim 9, wherein the first lower protection film pattern and the second lower protection film pattern are spaced apart from each other.

12. The OLED device of claim 9, wherein the second lower protection film pattern is disposed on a lower surface of the first lower protection film pattern.

13. The OLED device of claim 12, wherein a bending radius of the bending region is less than a bending radius of a portion of the display region where the display region is bent.

14. The OLED device of claim 9, wherein the lower protection film defines a groove in the bending region.

15. The OLED device of claim 9, wherein the display panel further includes:
a semiconductor element on the substrate;
a lower electrode on the semiconductor element;
a light emitting layer on the lower electrode;
an upper electrode on the light emitting layer; and
a thin film encapsulation structure on the upper electrode.

16. The OLED device of claim 15, wherein the semiconductor element includes:
an active layer on the substrate;
a gate insulation layer on the active layer;
a gate electrode on the gate insulation layer;
an insulating interlayer on the gate electrode, the gate insulation layer and the insulating interlayer defining an opening that exposes an upper surface of the substrate that is located in the bending region; and
source and drain electrodes on the insulating interlayer.

17. The OLED device of claim 15, wherein an upper structure includes a touch screen electrode layer and a polarizing layer on the thin film encapsulation structure.

18. The OLED device of claim 17, wherein the polarizing layer is disposed on the touch screen electrode layer.

19. The OLED device of claim 17, wherein the touch screen electrode layer is disposed on the polarizing layer.

20. The OLED device of claim 1, wherein a thickness of the protection layer is greater than a thickness of the adhesive layer, and the thickness of the adhesive layer is greater than a thickness of the antistatic layer.

21. The OLED device of claim 1, wherein a surface resistance of an upper surface of the adhesive layer that is in direct contact with the display panel is less than about $1 \times 10^{11}$ ohm/sq.

22. The OLED device of claim 1, wherein a weight ratio of the antistatic material based on a total weight of the adhesive layer is in a range between about 1 wt % and about 3 wt %.

23. The OLED device of claim 1, wherein the protection layer further includes a light blocking material.

24. The OLED device of claim 23, wherein the light blocking material comprises at least one material selected from the group consisting of carbon black, titanium nitride oxide, titanium black, phenylene black, aniline black, cyanine black, and nigrosine acid black.

25. The OLED device of claim 1, wherein the pad region has a width that is less than a width of the display region.

26. The OLED device of claim 1, wherein the pad electrodes are arranged in a first direction.

* * * * *